US006919503B2

(12) United States Patent
Nishitani et al.

(10) Patent No.: US 6,919,503 B2
(45) Date of Patent: Jul. 19, 2005

(54) MUSICAL TONE GENERATION CONTROL SYSTEM, MUSICAL TONE GENERATION CONTROL METHOD, AND PROGRAM FOR IMPLEMENTING THE METHOD

(75) Inventors: Yoshiki Nishitani, Hamakita (JP); Kenichi Miyazawa, Iwata-gun (JP); Katsuhiko Masuda, Fujieda (JP); Kazuhito Nakajima, Hamamatsu (JP)

(73) Assignee: Yamaha Corporation, Shizuoka-ken (JP)

( * ) Notice: Subject to any disclaimer, the term of this patent is extended or adjusted under 35 U.S.C. 154(b) by 268 days.

(21) Appl. No.: 10/271,397

(22) Filed: Oct. 15, 2002

(65) Prior Publication Data

US 2003/0070537 A1 Apr. 17, 2003

(30) Foreign Application Priority Data

Oct. 17, 2001 (JP) .................................... 2001-319871

(51) Int. Cl.[7] .......................... G10H 7/00; G10H 1/46; H03G 3/00

(52) U.S. Cl. .................................... 84/633; 84/DIG. 1

(58) Field of Search ......................... 84/600, 633, 665; 381/119

(56) References Cited

U.S. PATENT DOCUMENTS

| | | | | |
|---|---|---|---|---|
| 5,027,688 A | | 7/1991 | Suzuki et al. | |
| 5,046,394 A | | 9/1991 | Suzuki et al. | |
| 5,058,480 A | | 10/1991 | Suzuki et al. | |
| 5,177,311 A | | 1/1993 | Suzuki et al. | |
| 5,290,964 A | | 3/1994 | Hiyoshi et al. | |
| 5,313,010 A | | 5/1994 | Matsushima et al. | |
| 5,512,703 A | | 4/1996 | Usa | |
| 5,585,584 A | | 12/1996 | Usa | |
| 5,648,627 A | | 7/1997 | Usa | |
| 5,663,514 A | | 9/1997 | Usa | |
| 6,388,183 B1 | * | 5/2002 | Leh | 84/645 |
| 2001/0015123 A1 | | 8/2001 | Nishitani et al. | |
| 2002/0026866 A1 | * | 3/2002 | Nishitani et al. | 84/600 |
| 2002/0166438 A1 | * | 11/2002 | Nishitani et al. | 84/600 |
| 2002/0166439 A1 | * | 11/2002 | Nishitani et al. | 84/600 |

FOREIGN PATENT DOCUMENTS

JP 09-127937 5/1997

* cited by examiner

*Primary Examiner*—Jeffrey W Donels
(74) *Attorney, Agent, or Firm*—Harness, Dickey & Pierce, P.L.C.

(57) ABSTRACT

There is provided a musical tone generation control system that, even if the player moves, enables him/her to listen to good musical tones at a location to which the player has moved without the necessity of making adjustments by himself/herself. Information on a position of a listener is detected. A plurality of speakers are provided for sounding musical tones corresponding to a musical tone signal supplied from said tone generator. The volume of musical tones to be sounded from the plurality of speakers according to the detected position.

23 Claims, 19 Drawing Sheets

FIG. 14

⟨PART MANAGEMENT TABLE TA RELATING TO MUSICAL COMPOSITION α⟩

| PART TYPE | OPERATING TERMINAL ID |
|---|---|
| PIANO PART | ID-T1 |
| VIOLIN PART | ID-T2 |
| VIOLA PART | — |
| ⋮ | ⋮ |

MUSICAL TONE GENERATION CONTROL SYSTEM, MUSICAL TONE GENERATION CONTROL METHOD, AND PROGRAM FOR IMPLEMENTING THE METHOD

BACKGROUND OF THE INVENTION

1. Field of the Invention

The present invention relates to a musical tone generation control system and a musical tone generation control method that generate desired musical tones according to the position of a listener who is listening to musical tones, as well as a program for implementing the method.

2. Description of the Related Art

FIG. 20 is a view showing the construction of a conventional musical tone generating apparatus 100.

The musical tone generating apparatus 100 is comprised of an operating element group 105 composed of a plurality of operating elements 105*a*, a tone generator 110 that generates a musical tone signal according to the operation of each operating element 105*a* by reading out musical composition data or the like stored in a memory, not shown, under the control of a controller, not shown, and like signals, a signal processing section 120 that subjects the musical tone signal supplied from the tone generator 110 to predetermined filtering and other processing, an amplifier 130 that amplifies the musical tone signal outputted from the signal processing section 120, and a speaker 140 that outputs the musical tone signal amplified by the amplifier 130 as musical tones.

While listening to a desired piece of music by means of the musical tone generating apparatus 100, the user changes the position, direction, and the like of the speaker 140 or adjusts the volume of musical tones outputted from the speaker 140 if the music outputted from the speaker 140 cannot be clearly listened to (i.e. the sound field is not suitable).

Further, when a plurality of users play a desired musical composition by operating the respective operating elements 105*a* (i.e. session), each user checks whether musical tones of a part assigned to him/her are correctly sounded or not by carefully listening to the musical tones outputted from the speaker 140, for example.

If the user (hereinafter referred to as "the listener"), however, moves while listening to a desired piece of music by means of the musical tone generating apparatus 100, he/she has to change the position and direction of the speaker 140 again or to readjust the volume or the like of musical tones outputted from the speaker 140, so as to listen to the piece of music in the optimum sound field.

Further, when a plurality of users play a desired musical composition by operating the respective operating elements 105*a*, each user (hereinafter refereed to as "player") cannot easily discriminate musical tones of a part assigned to him/her among musical tones of a plurality of parts outputted from the speaker 140, and therefore cannot satisfactorily perform a session.

SUMMARY OF THE INVENTION

It is therefore a first object of the present invention to provide a musical tone generation control system and a musical tone generation control method that, even if the player moves, enable him/her to listen to good musical tones at a location to which the player has moved without the necessity of making adjustments by himself/herself, as well as a program for implementing the method.

It is a second object of the present invention to provide a musical tone generation control system and a musical tone generation control method that enable the user to discriminate musical tones of a part assigned to him/her even if a plurality of players play music by operating the respective operating elements, as well as a program for implementing the method.

To attain the first object, in a first aspect of the present invention, there is provided a musical tone generation control system comprising a detecting device that detects information on a position of a listener, a tone generator, a plurality of speakers that sound musical tones corresponding to a musical tone signal supplied from the tone generator, and a controller that controls a volume of musical tones to be sounded from the plurality of speakers according to the position of the listener detected by the detecting device.

In a preferred form of the first aspect, the controller selects one speaker from the plurality of speakers according to the information on the position of the listener detected by the detecting device, supplies the musical tone signal only to the selected speaker, and controls a volume of musical tones to be sounded from the selected speaker.

Preferably, the controller specifies one speaker closest to the listener from the plurality of speakers according to the information on the position of the listener detected by the detecting device, and provides control such that a volume of musical tones to be sounded from the specified speaker is greater than a volume of musical tones to be sounded from the speakers other than the specified speaker.

In another preferred form of the first aspect, the plurality of speakers are arranged so as to have different orientations in which musical tones are sounded from the plurality of speakers, and the controller specifies a speaker having an orientation corresponding to an area where the listener is located, from the plurality of speakers, and provides control such that a volume of musical tones to be sounded from the specified speaker is greater than a volume of musical tones to be sounded from the speakers other than the specified speaker.

Preferably, the detecting device comprises a plurality of human body sensors provided for respective ones of the plurality of speakers.

To attain the first and second objects, in a second aspect of the present invention, there is provided a musical tone generation control system comprising at least one operating terminal that can be carried by an operator, the operating terminal comprising a generating device that generates motion information by detecting motion of the operating terminal operated by the operator, and a transmission device that transmits the motion information, and a musical tone generating apparatus comprising a receiving device that receives the motion information, a musical tone generating device that generates musical tones, and a controller that controls generation of the musical tones by the musical tone generating device according to the motion information received by the receiving device, and the musical tone generating device comprises a tone generator, and a plurality of speakers that sound musical tones corresponding to a musical tone signal supplied from the tone generator, the receiving device comprises a detecting device that detects information on a position of the operator according to a reception state of the motion information upon receiving the motion information, and the controller controls a volume of musical tones to be sounded from the plurality of speakers according to the information on the position of the operator detected by the detecting device.

In a preferred form of the second aspect, the detecting device comprises a plurality of antennas each having a directivity in one direction for receiving the motion information, the plurality of antennas being arranged in different orientations, and the detecting device detects the information on the position of the operator according to the reception state of the motion information received by the plurality of antennas.

Preferably, the detecting device comprises an antenna having a directivity in one direction for receiving the motion information, and a rotating device that rotates the antenna, and the detecting device detects the information on the position of the operator according to the reception state of the motion information received by the antenna that is rotated by the rotating device.

To attain the first and second objects, in a third aspect of the present invention, there is provided a musical tone generation control system comprising at least one operating terminal that can be carried by an operator, the operating terminal comprising a generating device that generates motion information by detecting motion of the operating terminal operated by the operator, and a transmission device that transmits the motion information, and a musical tone generating apparatus comprising a receiving device that receives the motion information, a detecting device that detects information on a position of the operator, a musical tone generating device that generates musical tones, and a controller that controls generation of the musical tones by the musical tone generating device according to the motion information received by the receiving device, and the musical tone generating device comprises a tone generator, and a plurality of speakers that sound musical tones corresponding to a musical tone signal supplied from the tone generator, and the controller controls a volume of musical tones to be sounded from the plurality of speakers according to the information on the position of the operator detected by the detecting device.

In a preferred form of the third aspect, the detecting device comprises a plurality of human body sensors provided for respective ones of the plurality of speakers, and the controller specifies one speaker closest to the listener from the plurality of speakers according to the information on the position of the operator detected by the detecting device, and provides control such that a volume of musical tones to be sounded from the specified speaker is greater than a volume of musical tones to be sounded from the speakers other than the specified speaker.

To attain the first and second objects, in a fourth aspect of the present invention, there is provided a musical tone generation control system comprising at least one operating element unit that comprises a performance operating element and can be carried by a player, a first detecting device that detects information on a position of the player carrying the operating element unit, a second detecting device that detects an operating condition of the performance operating element, a tone generator that generates a musical tone signal according to the operating condition of the performance operating unit detected by the second detecting device, a plurality of speakers that sound musical tones corresponding to the musical tone signal generated by the tone generator, and a controller that controls a volume of the musical tones to be sounded from the plurality of speakers according to the information on the position of the player detected by the first detecting device.

To attain first and second objects, in a fifth aspect of the present invention, there is provided a musical tone generation control system comprising, at least one operating element unit that comprises a performance operating element and can be carried by a player, a first detecting device that detects information on a position of the player carrying the operating element unit a second detecting device that detects an operating condition of the performance operating element, a storage device that stores musical composition data, a tone generator that generates a first musical tone signal according to the operating condition of the performance operating unit detected by the second detecting device, and generates a second musical tone signal different from the first musical tone signal, based on the musical composition data, a plurality of speakers that comprise at least one speaker that sounds a monotone corresponding to either one of the first musical tone signal and the second musical tone signal generated by the tone generator, and at least one speaker that sounds a chord corresponding to both of the first musical tone signal and the second musical tone signal, and a controller that controls a volume of the monotone to be sounded from the at least one speaker that sounds the monotone and controls a volume ratio between respective musical tones constituting the chord to be sounded from the at least one speaker that sounds the chord, according to the information on the position of the player detected by the detecting device.

To attain the first and second objects, in a sixth aspect of the present invention, there is provided a musical tone generation control system comprising a plurality of operating element units that each comprise a performance operating element and can be carried by players, a first detecting device that detects information on a position of each player carrying the operating element unit for each of the operating element units, a second detecting device that detects an operating condition of the performance operating element of each of the operating element units for each of the operating element units, a tone generator that generates a musical tone signal according to the operating condition of the performance operating unit of each of the operating element units detected by the second detecting device, a plurality of speakers that comprise at least one speaker that sounds a monotone corresponding to one of the musical tone signals generated by the tone generator, and at least one speaker that sounds a chord corresponding to at least two of the musical tone signals, and a controller that controls a volume of the monotone to be sounded from the at least one speaker that sounds the monotone and controls a volume ratio between respective musical tones constituting the chord to be sounded from the at least one speaker that sounds the chord, according to the information on the position of the player detected by the detecting device.

To attain the first object, in a seventh aspect of the present invention, there is provided a musical tone generation control method comprising the steps of detecting information on a position of a listener, and controlling a volume of musical tones to be sounded from a plurality of speakers according to the detected position of the listener.

To attain the first and second objects, in a eighth aspect of the present invention, there is provided a musical tone generation control method executed by a musical tone generation control system comprising at least one operating terminal that can be carried by an operator and comprises a generating device that generates motion information by detecting motion of the operating terminal operated by the operator, and a transmission device that transmits the motion information, and a musical tone generating apparatus comprising a receiving device that receives the motion information, a musical tone generating device that generates musical tones, a controller that controls generation of the musical tones by the musical tone generating device according to the motion information received by the receiving device, and wherein the musical tone generating device comprises a tone generator, and a plurality of speakers that sound musical tones corresponding to a musical tone signal supplied from the tone generator, the musical tone generation control method comprising the steps of causing a detecting device provided in the receiver device to detect information on a position of the operator according to a reception state of the motion information upon receiving the motion information, and causing the controller to control a volume of musical tones to be sounded from the plurality of speakers according to the information on the position of the operator detected by the detecting device.

To attain the first and second objects, in a ninth aspect of the present invention, there is provided a musical tone generation control method executed by a musical tone generation control system comprising at least one operating terminal that can be carried by an operator and comprises a generating device that generates motion information by detecting motion of the operating terminal operated by the operator, and a transmission device that transmits the motion information, and a musical tone generating apparatus comprising a receiving device that receives the motion information, a detecting device that detects information on a position of the operator, a musical tone generating device that generates musical tones, and a controller that controls generation of the musical tones by the musical tone generating device according to the motion information received by the receiving device, and wherein the musical tone generating device comprises a tone generator, and a plurality of speakers that sound musical tones corresponding to a musical tone signal supplied from the tone generator, the musical tone generation control method comprising the steps of causing the controller to control a volume of musical tones to be sounded from the plurality of speakers according to the information on the position of the operator detected by the detecting device.

To attain the first and second objects, in a tenth aspect of the present invention, there is provided a musical tone generation control method executed by a musical tone generation control system comprising at least one operating element unit that comprises a performance operating element and can be carried by a player, a first detecting device, a second detecting device, a tone generator, a plurality of speakers, and a controller, the musical tone generation control method comprising the steps of causing the first detecting device to detect information on a position of the player carrying the operating element unit, causing the second detecting device to detect an operating condition of the performance operating element, causing the tone generator to generate a musical tone signal according to the operating condition of the performance operating element detected by the second detecting device, causing the plurality of speakers to sound musical tones corresponding to the musical tone signal generated by the tone generator, and causing the controller to control a volume of the musical tones to be sounded from the plurality of speakers according to the information on the position of the player detected by the first detecting device.

To attain the first and second objects, in an eleventh aspect of the present invention, there is provided a musical tone generation control method executed by a musical tone generation control system comprising at least one operating element unit that comprises a performance operating element and can be carried by a player, a first detecting device, a second detecting device, a storage device, a tone generator, a plurality of speakers, and a controller, the musical tone generation control method comprising the steps of causing the first detecting device to detect information on a position of the player carrying the operating element unit, causing the second detecting device to detect an operating condition of the performance operating element, storing musical composition data in the storage device, causing the tone generator to generate a first musical tone signal according to the operating condition of the performance operating element detected by the second detecting device, causing the tone generator to generate a second musical tone signal different from the first musical tone signal and based on the musical composition data, causing at least one speaker of the plurality of speakers to sound a monotone corresponding to either one of the first musical tone signal and the second musical tone signal generated by the tone generator, and causing at least one speaker of the plurality of speakers to sound a chord corresponding to both of the first musical tone signal and the second musical tone signal, and causing the controller to control a volume of the monotone to be sounded from the at least one that sounds the monotone and controls a volume ratio between musical tones constituting the chord to be sounded from the at least one that sounds the chord according to the information on the position of the player detected by the detecting device.

To attain the first object, in a twelfth aspect of the present invention, there is provided a program for implementing a musical tone generation control method, comprising a detecting module for detecting information on a position of a listener, and a control module for controlling a volume of musical tones to be sounded from a plurality of speakers according to the position of the listener detected by the detecting module.

To attain the first and second objects, in a thirteenth aspect of the present invention, there is provided a program for implementing a musical tone generation control method executed by a musical tone generation control system comprising at least one operating terminal adapted to be carried by an operator, and a musical tone generating apparatus comprising a receiving device that receives the motion information, a musical tone generating device that generates musical tones, and a controller that controls generation of the musical tones by the musical tone generating device according to the motion information received by the receiving device, and wherein the musical tone generating device comprises a tone generator and a plurality of speakers that sound musical tones corresponding to a musical tone signal supplied from the tone generator, the program comprising a detecting module for causing a detecting device provided in the receiver device to detect information on a position of the operator according to a reception state of the motion information upon receiving the motion information, and a control module for causing the controller to control a volume of musical tones to be sounded from the plurality of speakers according to the information on the position of the operator detected by the detecting module.

To attain the first and second objects, in a fourteenth aspect of the present invention, there is provided a program for implementing a musical tone generation control method executed by a musical tone generation control system comprising at least one operating terminal that can be carried by an operator and comprises a generating device that generates motion information by detecting motion of the operating terminal operated by the operator, and a transmission device that transmits the motion information, and a musical tone generating apparatus comprising a receiving device that receives the motion information, a detecting device that detects information on a position of the operator, a musical tone generating device that generates musical tones, and a controller that controls generation of the musical tones by the musical tone generating device according to the motion information received by the receiving device, and wherein the musical tone generating device comprises a tone generator, and a plurality of speakers that sound musical tones corresponding to a musical tone signal supplied from the tone generator, the step comprising a control module for causing the controller to control a volume of musical tones to be sounded from the plurality of speakers according to the information on the position of the operator detected by the detecting device.

To attain the first and second objects, in a fifteenth aspect of the present invention, there is provided a program for implementing a musical tone generation control method executed by a musical tone generation control system comprising at least one operating element unit that comprises a performance operating element and can be carried by a player, a first detecting device, a second detecting device, a tone generator, a plurality of speakers, and a controller, the program comprising a first detecting module for causing the first detecting device to detect information on a position of the player carrying the operating element unit, a second detecting module for causing the second detecting device to detect an operating condition of the performance operating element, a generating module for causing the tone generator to generate a musical tone signal according to the operating condition of the performance operating element detected by the second detecting device, a sounding module for causing the plurality of speakers to sound musical tones corresponding to the musical tone signal generated by the tone generator, and a control module for causing the controller to control a volume of the musical tones to be sounded from the plurality of speakers according to the information on the position of the player detected by the first detecting device.

To attain the first and second objects, in a sixteenth aspect of the present invention, there is provided a program for implementing a musical tone generation control method executed by a musical tone generation control system comprising at least one operating element unit that comprises a performance operating element and can be carried by a player, a first detecting device, a second detecting device, a storage device, a tone generator, a plurality of speakers, and a controller, the program comprising a first detecting module for causing the first detecting device to detect information on a position of the player carrying the operating element unit, a second detecting module for causing the second detecting device to detect an operating condition of the performance operating element, a storage module for storing musical composition data in the storage device, a first generating module for causing the tone generator to generate a first musical tone signal according to the operating condition of the performance operating element detected by the second detecting device, a second generating module for causing the tone generator to generate a second musical tone signal different from the first musical tone signal and based on the musical composition data, a sounding module for causing at least one speaker of the plurality of speakers to sound a monotone corresponding to either one of the first musical tone signal and the second musical tone signal generated by the tone generator, and causing at least one speaker of the plurality of speakers to sound a chord corresponding to both of the first musical tone signal and the second musical tone signal, and a control module for causing the controller to control a volume of the monotone to be sounded from the at least one that sounds the monotone and controls a volume ratio between musical tones constituting the chord to be sounded from the at least one that sounds the chord according to the information on the position of the player detected by the detecting device.

According to the first aspect of the present invention, upon detection of information on the position of a listener listening to musical tones being sounded from a plurality of speakers (e.g. information indicative of the position and direction of a listener), the volume of the musical tones being sounded from the plurality of speakers is controlled according to the position of the listener. In a case where the plurality of speakers are arranged in different orientations, control is provided such that musical tones are sounded from a speaker having an orientation toward, i.e. being oriented toward the position of the listener but no musical tone is sounded from the other speakers so that the listener can listen to the musical tones in a good sound field.

According to the second aspect of the present invention, upon receiving motion information transmitted from the operating terminal, the receiving device of the musical tone generating apparatus detects information on the position of the operator operating the operating terminal to control the volume of musical tones sounded via the plurality of speakers according to the position of the operator. In a case where the plurality of speakers are arranged in different orientations, control is provided such that musical tones are sounded from a speaker having an orientation toward, i.e. being oriented toward the position of the operator but no musical tones is sounded from the other speakers so that the operator operating the operating terminal can listen to the musical tones according to the operation in a good sound field.

The above and other objects, features, and advantages of the invention will become more apparent from the following detailed description taken in conjunction with the accompanying drawings.

BRIEF DESCRIPTION OF THE DRAWINGS

FIG. 14 is a view showing a part management table used in the second embodiment;

DETAILED DESCRIPTION OF THE PREFERRED EMBODIMENTS

A description will now be given of preferred embodiments of the present invention with reference to the drawings. It is to be understood, however, that there is no intention to limit the present invention to the following embodiments but certain changes and modifications may be possible within the scope of the appended claims.

Figure 1:
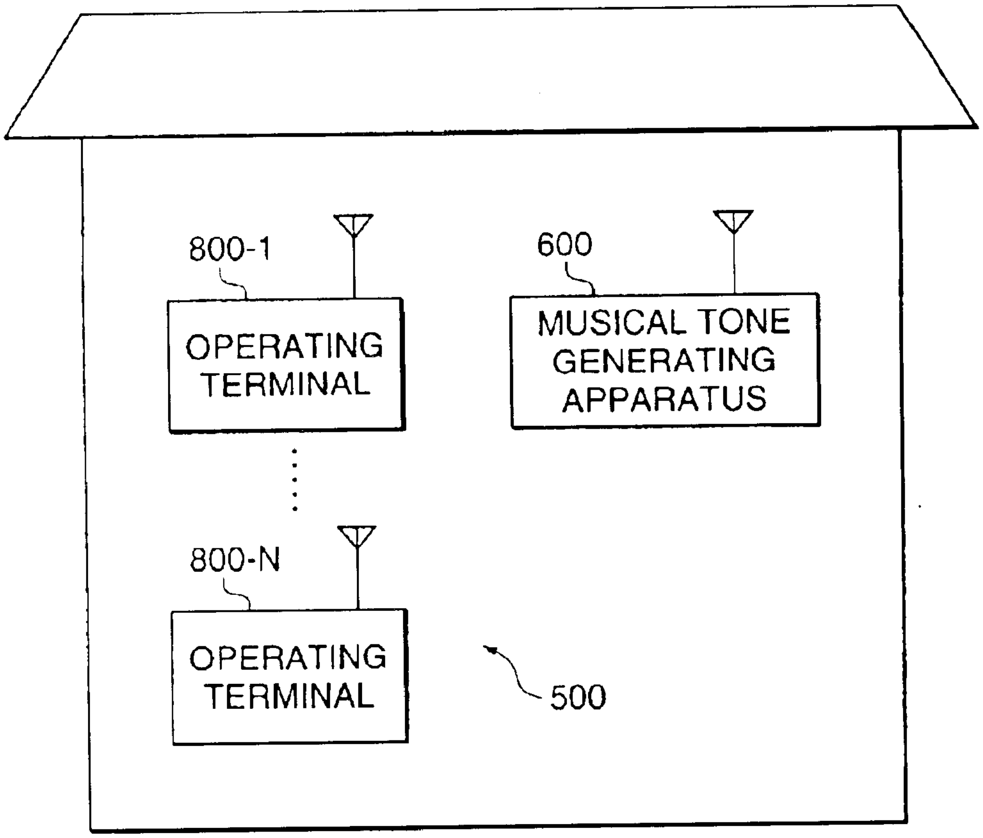
FIG. 1 is a view showing the whole arrangement of a musical tone generation control system according to a first embodiment of the present invention.

FIG. 1 is a view showing the arrangement of a musical tone generation control system 500 according to a first embodiment of the present invention.

The musical tone generation control system 500 is used in music schools, schools in general, homes, halls, and the like, and is comprised of a musical tone generating apparatus 600 and a plurality of operating terminals 800-N (N≧1) provided for the musical tone generating apparatus 600.

The musical tone generation control system 500 according to the present embodiment enables users at various locations to manage musical tone generation and performance and reproduction (hereinafter referred to as "musical tone generation and the like") carried out by the musical tone generating apparatus 600.

Figure 2:
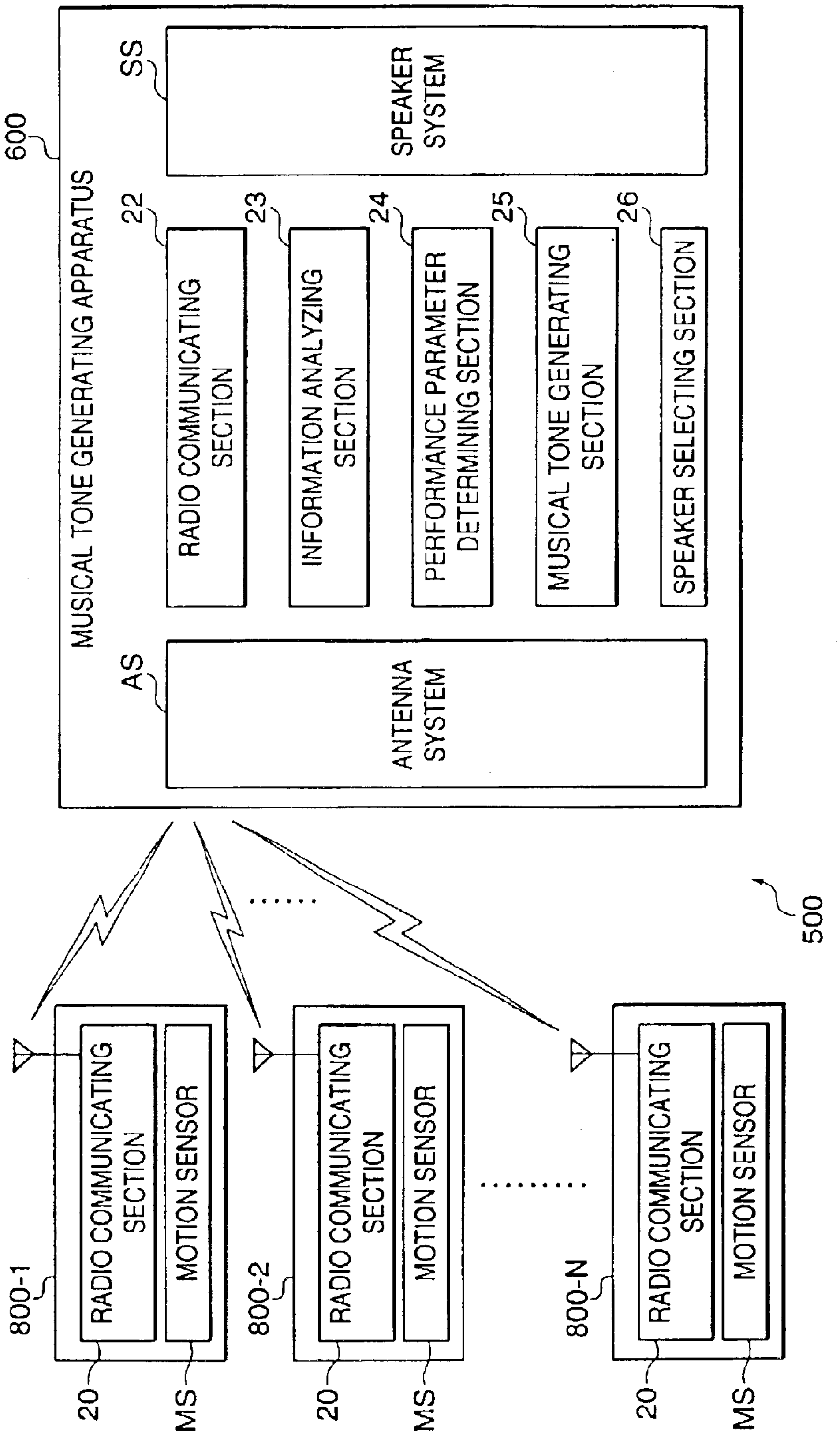
FIG. 2 is a view showing the functional arrangement of the musical tone generation control system according to the first embodiment.
Figure 3:
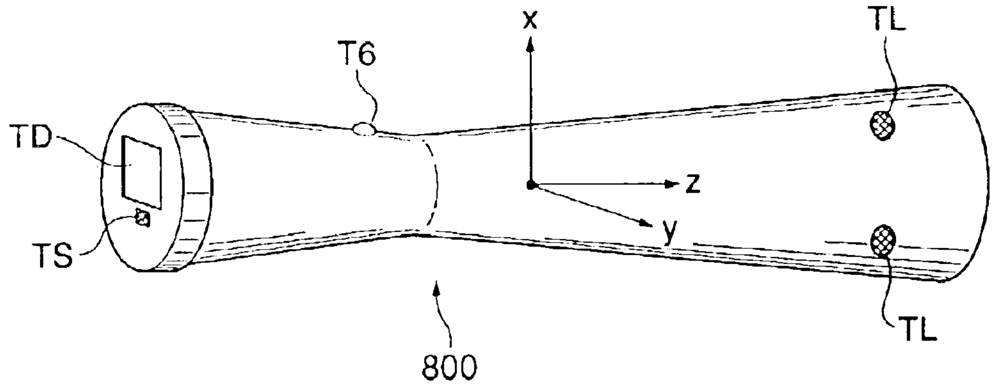
FIG. 3 is a view showing the appearance of an operating terminal used in the musical tone generation control system according to the first embodiment.
Figure 4:
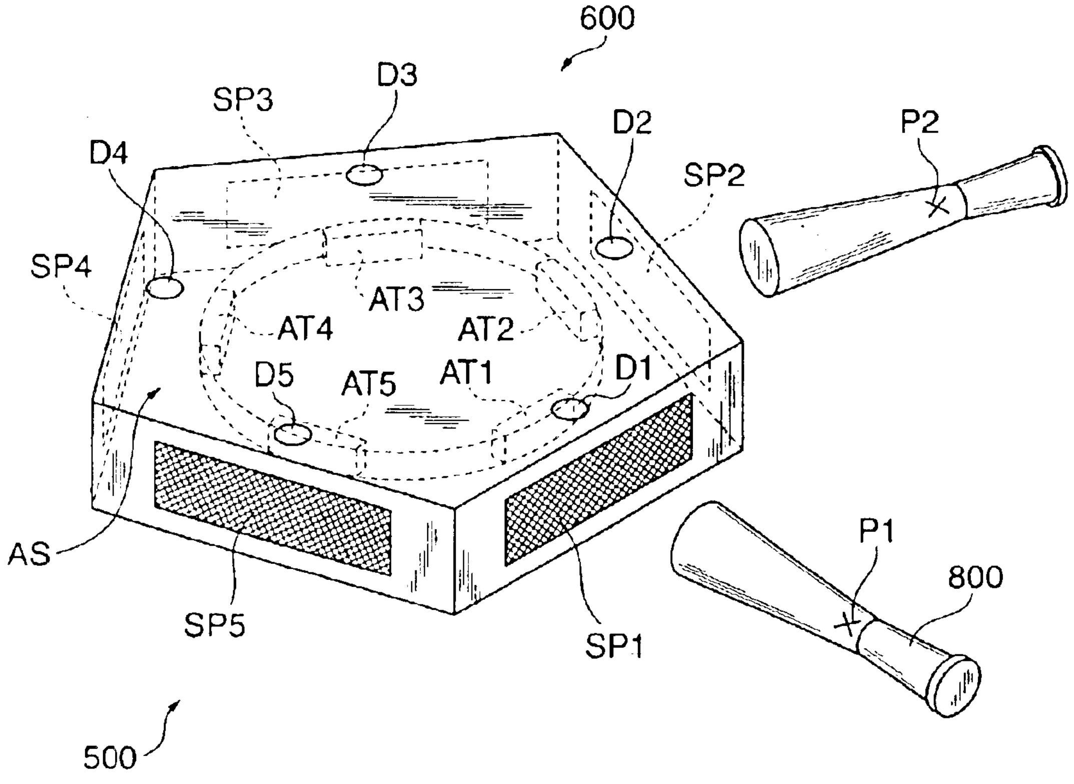
FIG. 4 is a view showing the appearance of a musical tone generating apparatus of the musical tone generation control system according to the first embodiment.

FIG. 2 is a view showing the functional arrangement of the musical tone generation control system 500 installed in a certain music school or the like, FIG. 3 is a view showing the appearance of an operating terminal 800 constituting the musical generation control system 500, and FIG. 4 is a view showing the appearance of the musical tone generating apparatus 600 constituting the musical tone generation control system 500. In the following description, the operating terminals 800-1 to 800-N will be referred to as "the operating terminal 800" if there is no necessity of discriminating between them.

The operating terminal 800 is adapted to be carried by an operator, for example, is designed to be held by the operator or worn on a part of the human body (refer to FIG. 3).

A motion sensor MS in FIG. 2 generates motion information by detecting a motion of the operator who is carrying the operating terminal 800, and sequentially outputs the motion information to a radio communicating section 20. A variety of known sensors such as a three-dimensional acceleration sensor, a three-dimensional velocity sensor, a two-dimensional acceleration sensor, a two-dimensional velocity sensor, and a strain sensor may be used as the motion sensor MS.

The radio communicating section 20 carries out radio-communication of data between the operating terminal 800 and the musical tone generating apparatus 600. Upon receipt of the motion information corresponding to the motion of the operator from the motion sensor MS, the radio communicating section 20 assigns an ID for the identifying the motion information as the one received from the operating terminal 800 to the musical tone generating apparatus 600 and radio-transmits the motion information with the ID assigned thereto to the musical tone generating apparatus 600.

The musical tone generating apparatus 600 has a substantially pentagonal column-shaped body and carries out the musical tone generation and the like according to the motion information transmitted from the operating terminal 800 (refer to FIG. 4).

A radio communicating section 22 in FIG. 22 receives the motion information radio-transmitted from the operating terminal 800 via an antenna system AS, and outputs the received motion information to an information analyzing section 23.

The information analyzing section 23 carries out a predetermined analysis of the motion information supplied from the radio communicating section 22, and outputs the analysis result to a performance parameter determining section 24.

The performance parameter determining section 24 determines performance parameters such as volume and tempo of musical tones according to the motion information analysis result supplied from the information analyzing section 23.

Upon receipt of musical composition data (e.g. data conforming to the MIDI (Musical Instruments Digital Interface) standards) based on the performance parameters determined by the performance parameter determining section 24, a musical tone generating section 25 generates performance data based on the musical composition data.

A speaker system SS generates a musical tone signal based on the performance data supplied from the musical tone generating section 25 and sounds musical tones according to the generated musical tone signal.

A speaker selecting section 26 selects a speaker for use in sounding from a plurality of speakers constituting the speaker system SS (details of the selecting method will be described later).

A detailed description will now be given of the arrangement of the operating terminal 800 and the musical tone generating apparatus 600, which achieve the above described functions.

As shown in FIG. 3, the operating terminal 800 according to the present embodiment is a hand-held operating terminal adapted to be held by the operator, and is comprised of a base portion (at the left in FIG. 3) and an end portion (at the right in FIG. 3) and is tapered such that the diameter decreases away from both ends toward the central part thereof.

The base portion of the operating terminal 800 has a smaller mean diameter than the end portion so that it can easily be held by a hand, and serves as a holding section. An LED (Light Emitting Diode) display TD and a battery power switch TS are provided on an outer surface at the bottom (the left end in FIG. 3) of the base portion, and an operating switch T6 is provided on an outer surface at the center of the base portion. On the other hand, a plurality of LED emitters TL are provided in the vicinity of the leading end of the end portion. The operating terminal 800 thus configured has a variety of devices incorporated therein.

Figure 5:
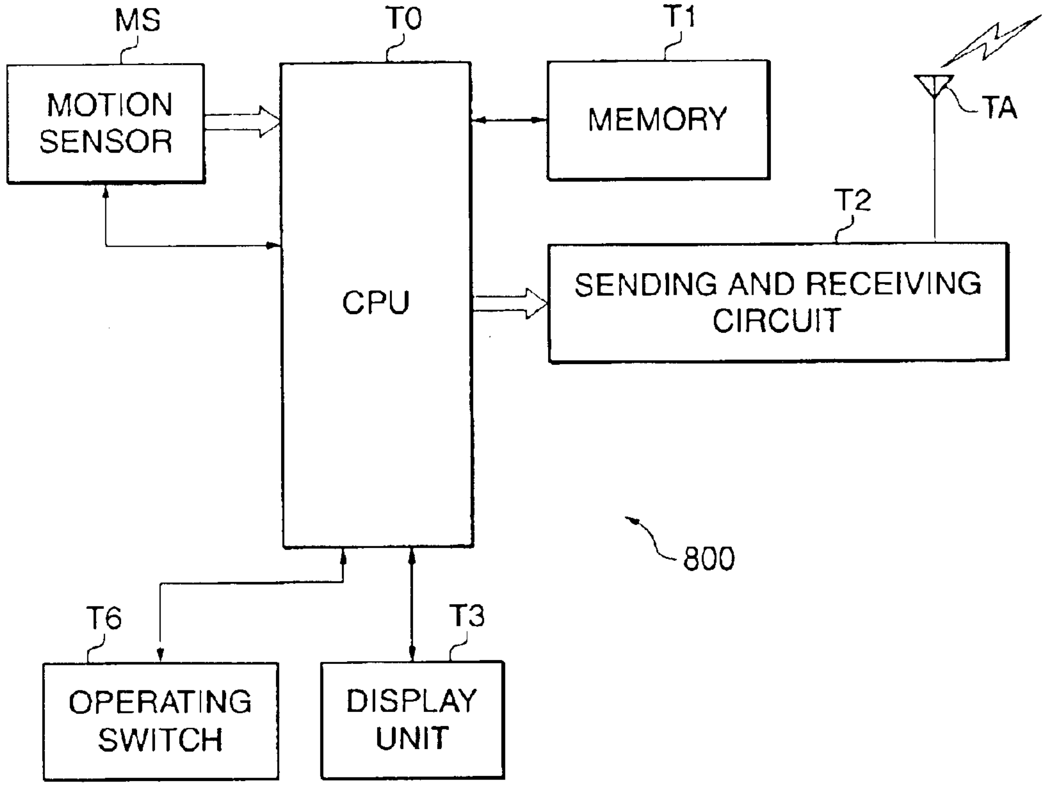
FIG. 5 is a block diagram showing the arrangement of the operating terminal used in the musical tone generation control system according to the first embodiment.

FIG. 5 is a block diagram showing the internal configuration of the operating terminal 800.

A CPU (Central Processing Unit) T0 controls the operations of component parts of the operating terminal 800 such as the motion sensor MS according to a variety of control programs stored in a memory T1 (e.g. comprised of a ROM or a RAM). The CPU T0 has a function of assigning an ID, which is intended to identify the motion information as the one transmitted from the operating terminal 800, to the motion information transmitted from the motion sensor MS, and other functions.

A three-dimensional acceleration sensor or the like is used as the motion sensor MS, which outputs the motion information according to the direction, magnitude, and velocity of motion of the operator carrying the operating terminal 800 by the hand. Although in the present embodiment, the motion sensor MS is incorporated in the operating terminal 800, the motion sensor MS may be attachable to the human body at an arbitrary portion thereof.

A sending and receiving circuit T2 is comprised of a high-frequency transmitter and a power amplifier, neither of which is shown, as well as an antenna TA, and has a function of transmitting the motion information together with the ID assigned thereto supplied from the CPU T0 to the musical tone generating apparatus 600, and other functions. Namely, the sending and receiving circuit T2 realizes the function of the radio communicating section 20 appearing in FIG. 2.

A display unit T3 is comprised of the LED display TD and the plurality of LED emitters TL mentioned above (refer to FIG. 3), and displays a variety of information indicative of the sensor number, operation on/off state, and power alarm, and the like. The operating switch T6 is used for turning the power of the operating terminal 800 on and off, setting the mode, and other settings. These component parts of the operating terminal 800 are supplied with drive power from a battery power unit, not shown. As this battery power unit, it is possible to use a primary cell or to use a rechargeable secondary cell.

Figure 6:
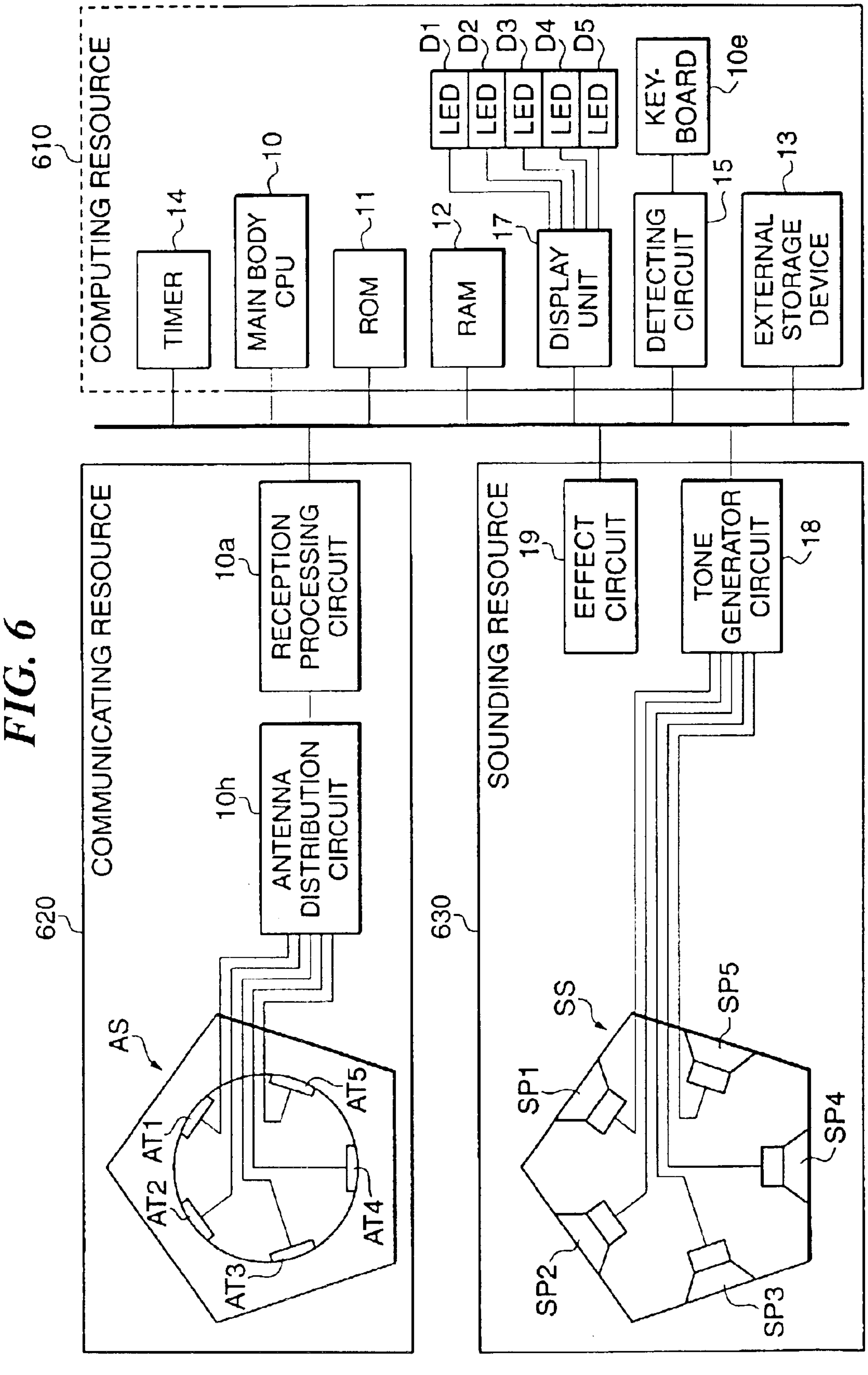
FIG. 6 is a view showing the arrangement of the musical tone generating apparatus of the musical tone generation control system according to the first embodiment.

FIG. 6 is a block diagram showing the hardware construction of the musical tone generating apparatus 600.

The musical tone generating apparatus 600 is comprised of a computing resource 610 that provides ordinary personal computer functions, a communicating resource 620 that provides a communicating function, and a sounding resource 630 that provides a sounding function.

A main body CPU 10 that controls the operations of component parts of the musical tone generating apparatus 600, and provides control according to predetermined programs under the time management of a timer 14 used for generation of a tempo clock, an interrupt clock, or the like to centrally execute programs such as a performance processing program relating to determination of performance parameters, modifications of performance data, and control of reproduction. A ROM (Read Only Memory) 11 stores predetermined control programs for controlling the musical tone generating apparatus 600. The control programs include the performance processing program relating to determination of performance parameters, modifications of performance data, and control of reproduction, a variety of data and tables, and the like. A RAM (Random Access Memory) 12 stores data and parameters required for the execution of the control programs, and serves as a work area that temporarily stores a variety of data during the execution of the control programs.

The main body CPU 10 carries out performance processing according to the above-mentioned performance processing program, analyzes the motion information transmitted from the operating terminal 800, i.e. the motion information representing the motion of the human body of the operator carrying the operating terminal 800, and determines the performance parameters according to the analysis result. Namely, the main body CPU 10 realizes the functions of the information analyzing section 23 and the performance parameter determining section 24 in FIG. 2.

Referring again to FIG. 6, a keyboard 10*e* is connected to a detecting circuit 15. The operator makes various settings such as setting of modes required for control of the performance data, assignment of processing and functions corresponding to the ID identifying the motion information as the one transmitted from the operating terminal 800, setting of tone color (tone generator) in a performance track by operating the keyboard 10*e*.

Five LED display units D1 to D5 are connected to the display circuit 17. The LED display units D1 to D5 are used for notifying the operator of the speaker for use in sounding, and as shown in FIG. 4, each of the LED display units D1 to D5 is arranged in the vicinity of a joint where an upper surface and each side surface of the musical tone generating apparatus 600 are joined to each other.

An external storage device 13 is comprised of a storage device such as a hard disk drive (HDD), compact disk read only memory (CD-ROM), floppy disk drive (FDD), magneto-optical (MO) disk drive, or digital versatile disk (DVD) drive, and is capable of storing various control programs and various data such as musical composition data. Thus, the variety of programs such as the performance processing program required for determination of performance parameters, modifications of performance data, and control of reproduction can be read from the external storage device 13 into the RAM 12, and the ROM 11 should not necessarily be used. As the need arises, the processing result may be recorded in the external storage device 13.

The communicating resource 620 is comprised of the antenna system AS that is intended to receive a signal indicative of the motion information transmitted from the operating terminal 800, an antenna distribution circuit 10*h* composed of a multi-channel high frequency receiver or the like, a reception processing circuit 10*a* that performs predetermined signal processing on the signal received from the operating terminal 800 via the antenna system AS and the antenna distribution circuit 10*h*, and so forth. Namely, the antenna distribution circuit 10*h* and the reception processing circuit 10*a* as well as the main body CPU 10 realize the functions of the radio communicating section 22 in FIG. 2.

Figure 7:
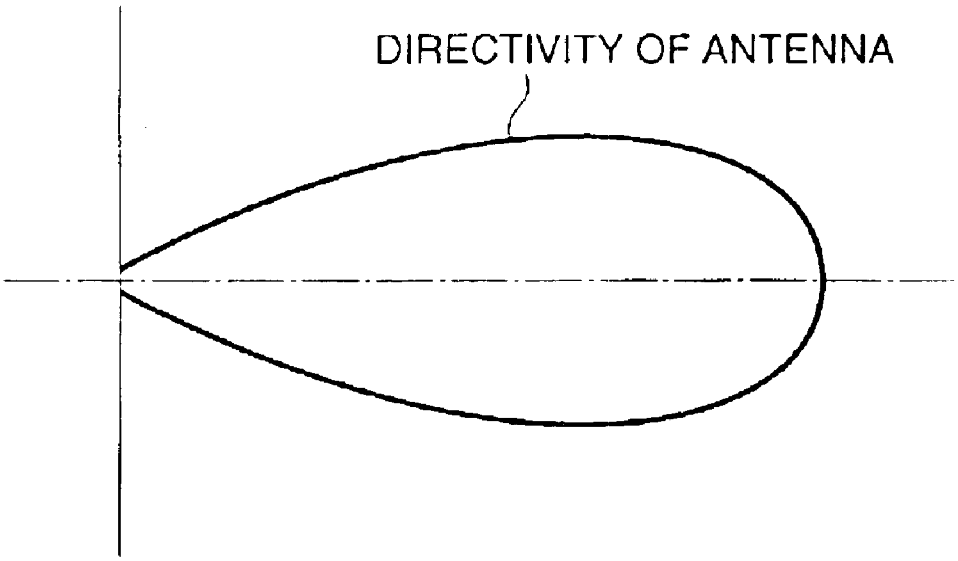
FIG. 7 is a view useful in explaining the directivity (orientation) of an antenna used in the musical tone generation control system according to the first embodiment.
Figure 8B:
FIGS. 8A and 8B is a view showing a change in reception level of each antenna used in the musical tone generation control system according to the first embodiment.
Figure 8A:
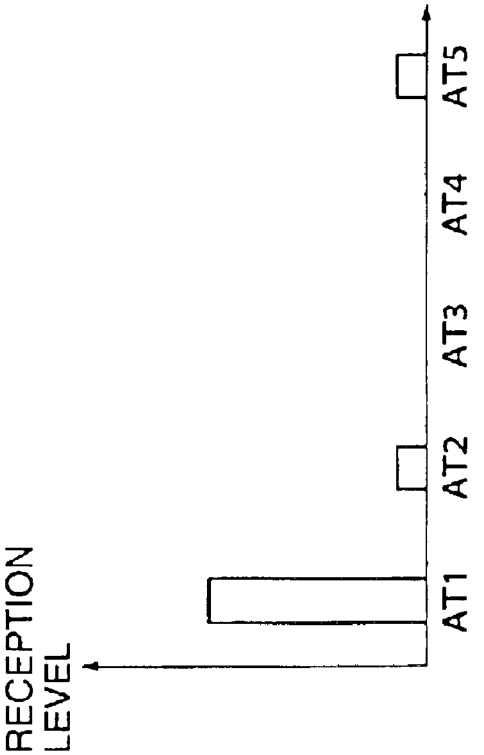

The antenna system AS is comprised of five antennas AT1 to AT5 provided for respective speakers SP1 to SP5, described later (refer to FIG. 4). The five antennas AT1 to AT5 have a sharp directivity as shown in FIG. 7. The position of the operating terminal 800 transmitting the motion information and the like to the musical tone generating apparatus 600 can be identified by comparing the reception levels of the antenna AT1 to AT5 or the like. For example, if the operator operating the operating terminal 800 moves from a point P1 (opposed to the speaker SP1) to a point P2 (opposed to the speaker SP2) in FIG. 4, the reception levels detected by the respective antennas AT1 to AT5 change as shown in FIGS. 8A and 8B. Specifically, if the operator is located at the point P1, the reception level detected by the antenna AT1 provided at the position corresponding to the speaker SP1 is the highest, and if the operator moves to the point P2, the reception level detected by the antenna AT2 is the highest.

Referring again to FIG. 6, the reception processing circuit 10*a* performs predetermined signal processing on the signal received from the operating terminal 800 via the antenna system AS and the antenna distribution circuit 10*h*, and on the other hand, compares the reception levels of the antennas AT1 to AT5 to specify the antenna with the highest reception level, and transmits antenna identification information for identifying the specified antenna to the main body CPU 10. After finding the direction in which the operator is located, according to the received antenna identification information, the main body CPU 10 selects the speaker that is oriented toward the found direction for use in sounding musical tones in the found direction, from among the plurality of speakers constituting the speaker system SS. Namely, the main body CPU 10 realizes the functions of the speaker selecting section 26 in FIG. 2.

The sounding resource 630 is comprised of a tone generator circuit 18 and an effect circuit 19 that control the performance data according to the performance parameters set by the main body CPU 10 to generate the performance data which has been processed according to the motion of the operator, and the speaker system SS that generates a musical tone signal based on the processed performance data, and sounds performance musical tones. Namely, the tone generator circuit 18 and the effect circuit 19 as well as the main body CPU 10 realize the functions of the musical tone generating section 25 in FIG. 2.

Figure 9:
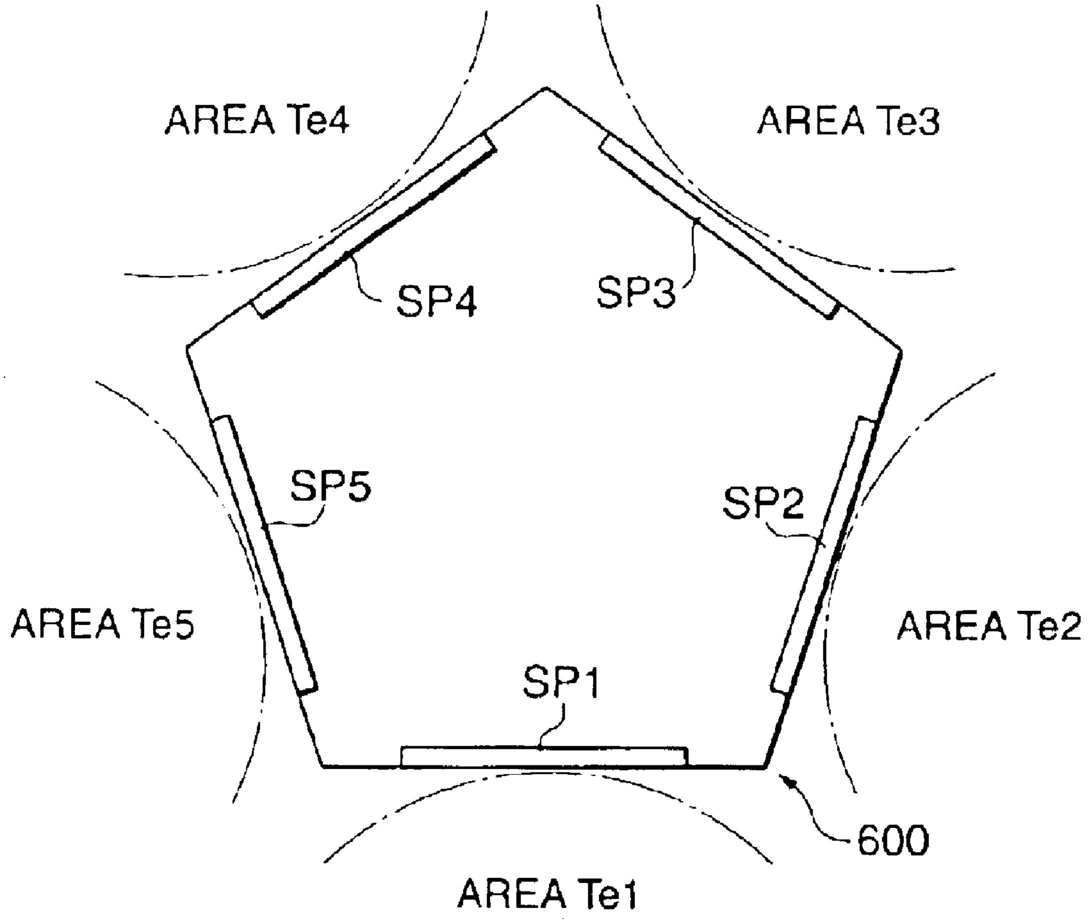
FIG. 9 is a view showing audition areas of musical tones sounded from each flat speaker used in the musical tone generation control system according to the first embodiment.

As shown in FIG. 4, the speaker system SS is comprised of a D/A converter and an amplifier, neither being shown, and the five flat speakers SP1 to SP5 which are disposed to have respective orientations, provided at respective side surfaces of the pentagonal column-shaped musical tone generating apparatus 600. The operator operating the operating terminal 800 can well listen to good musical tones sounded from the flat speakers SP1 to SP5 in areas Te1 to Te5 appearing in FIG. 9.

According to the present embodiment, the main body CPU 10 detects the direction in which the operator is located according to the above-mentioned antenna identification information, and selects a flat speaker having an orientation toward the detected direction of the operator, to sound musical tones. Therefore, even if the operator operates the operating terminal 800 while moving or even if a plurality of operators make performance by operating the respective corresponding operating terminals 800 (session, etc.), the operator can well listen to good musical tones according to his/her operation. A detailed description of the specific operation of the musical tone generating apparatus 600 will given later during description of the operation of the present embodiment.

A description will now be given of a motion information analyzing process, a performance parameter determining process, a musical tone generating process, and a speaker selecting process (hereinafter collectively referred to as "the musical tone generation control process") carried out in a case where a three-dimensional acceleration sensor is used as the motion sensor MS, with reference to FIG. 10 and other figures.

Figure 10:
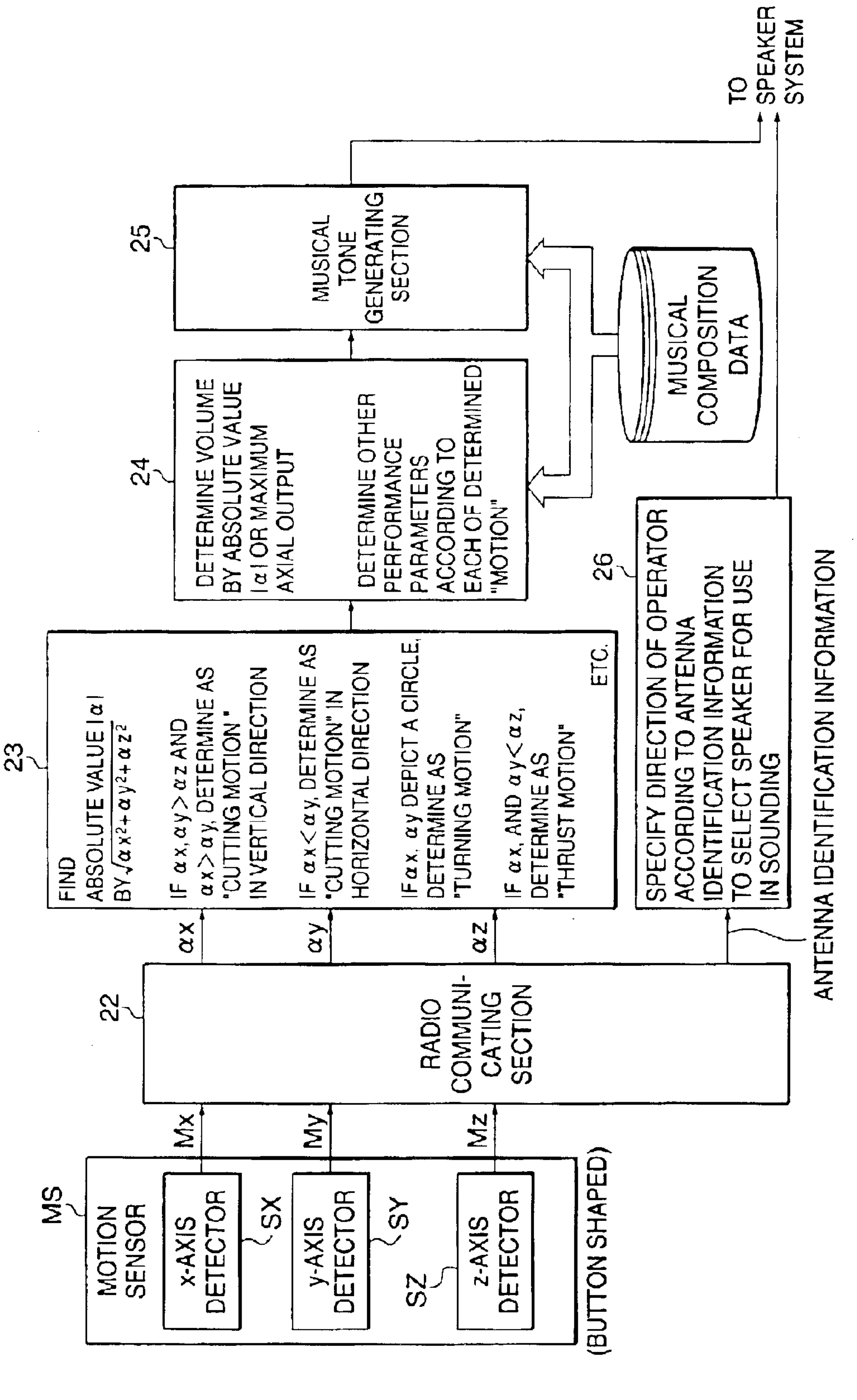
FIG. 10 is a function block diagram useful in explaining the operation of the musical tone generating apparatus of the musical tone generation control system according to the first embodiment.

FIG. 10 is a block diagram showing functions relating to carrying out performance of a musical composition using the three-dimensional acceleration sensor.

If the operator holds and operates the operating terminal 800 in which the motion sensor MS is incorporated, the motion information corresponding to the operating direction and the operating force is transmitted from the operating terminal 800 to the musical tone generating apparatus 600. In further detail, signals Mx, My, and Mz indicative respectively of an acceleration $\alpha x$ ("x" is a subscript) in the direction of an x-direction (vertical), an acceleration $\alpha y$ ("y" is a subscript) in a y-direction (horizontal: rightward and leftward) and an acceleration $\alpha z$ ("z" is a subscript) in a z-direction (horizontal: forward and backward), respectively are outputted from an x-axis detector SX, a y-axis detector SY, and a z-axis detector SZ in the motion sensor MS of the operating terminal 800, and the CPU T0 radio-transmits the signals Mx, My, and Mz with respective IDs assigned thereto as motion information to the musical tone generating apparatus 600. Upon receipt of the motion information with the IDs assigned thereto via the antenna system AS, the ratio communicating section 22 compares the reception levels detected by the antennas AT1 to AT5 to specify the antenna AT detecting the highest detection level, and generates and outputs antenna identification information for identifying the specified antenna At to the speaker selecting section 26, while referring to a table, not shown, to compare the IDs assigned to the received motion information with IDs registered in the table. If determining that the same IDs as the IDs assigned to the motion information are registered in the table, the radio communicating section 22 outputs the motion information as acceleration data $\alpha x$, $\alpha y$, and $\alpha z$ to the information analyzing section 23.

After specifying the direction in which the operator is located, according to the received antenna identification information, the speaker selecting section 26 selects the speaker that has an orientation toward the specified direction, for use in sounding, from the plurality of speakers constituting the speaker system SS so that musical tones can be sounded toward the specified direction.

On the other hand, the information analyzing section 23 analyzes data on the acceleration in the direction of each axis to find an absolute value $|\alpha|$ of the acceleration represented by the following expression (1):

$$|\alpha|=(\alpha x*\alpha x+\alpha y*\alpha y+\alpha z*\alpha z)^{1/2} \quad (1)$$

The information analyzing section 23 then compares the accelerations $\alpha x$ and $\alpha y$ with the acceleration $\alpha z$. If the comparison result shows that the following relationship (2) holds, that is, if the acceleration $\alpha z$ in the z-direction is greater than the accelerations $\alpha x$ and $\alpha y$ in the x-direction and $\alpha y$ in the y-direction, the information analyzing section 23 determines that the motion is a "thrust motion" in which the operation terminal 800 is thrusted:

$$\alpha x<\alpha z \text{ and } \alpha y<\alpha z \quad (2)$$

Conversely, if the acceleration $\alpha z$ in the z-direction is smaller than the accelerations $\alpha x$ and $\alpha y$, the information analyzing section 23 determines that the motion is a "cutting motion" in which the air is cut by the operation terminal 800. In this case, by comparing the values of the accelerations αx and αy in the x- and y-directions with each other, the information analyzing section 23 can determine whether the "cutting motion" is performed in the vertical direction (x-direction) or the horizontal direction (y-direction).

By not only comparing the components in the direction of the axes x, y, and z with each other but also comparing the magnitude of the components αx, αy, and αz themselves with respective predetermined thresholds, the information analyzing section 23 can determine that the motion is a "combined motion" in which the above-described motions are combined if the components αx, αy, and αz are equal to or greater than the predetermined thresholds. For example, if αz>αx and αz>αy, and αx>"the threshold of the x component", the information analyzing section 23 determines that the motion is a "motion in which the operating terminal 800 is thrusted while the air is cut in the vertical direction (x-direction)", and if αz<αx, αz<αy, αx>"the threshold of the x component", and αy>"the threshold of the y component", the information analyzing section 23 determines that the motion is a "motion in which the air is cut by the operating terminal 800 in a diagonal direction (x- and y-directions)". Further, by detecting a phenomenon that the values of the accelerations αx and αy in the x-direction and the y-direction are changed relative to each other in such a way as to describe a circle, the information analyzing section 23 can determine that the motion is a "turning motion" in which the operating terminal 800 is turned round.

The performance parameter determining section 24 determines a variety of performance parameters corresponding to the musical composition data according to the determination results obtained by the analyzing process carried out by the information analyzing section 23. For example, the performance parameter determining section 24 controls the volume with which the performance data is reproduced according to the absolute value |α| of the acceleration and the magnitude of the maximum component among the components αx, αy, and αz.

The performance parameter determining section 24 also controls other parameters according to the determination results. For example, the performance parameter determining section 24 controls the tempo according to the cycle of the "vertical (x-direction) cutting motion". On the other hand, if it is determined that the "vertical cutting motion" is quick and small, the performance parameter determining section 24 provides an articulation such as an accent, and if it is determined that the "vertical cutting motion" is slow and wide, the performance parameter determining section 24 lowers the pitch. If it is determined that the motion is the "horizontal (y-direction) cutting motion", the performance parameter determining section 24 provides a slur effect, and if it is determined that the motion is the "thrust motion", the performance parameter determining section 24 provides a staccato effect in the timing of the thrust motion by reducing the musical tone generation period, and inserts a single tone (e.g. a percussion musical instrument tone or a hoy) according to the magnitude of the thrust motion into musical tones being generated. Further, if it is determined that the motion is a combination of the "horizontal (y-direction) cutting motion" and the "thrust motion", the performance parameter determining section 24 provides the above-described two kinds of control, and if it is determined that the motion is the "turning motion", the performance parameter determining section 24 provides control so as to raise the reverberation effect if the cycle is long, and to generate a trill if the cycle is short. These types of control are only examples, and the present invention should not be limited to this. For example, the performance parameter determining section 24 may control the dynamics according to a local peak value of the acceleration in the direction of each axis, and control the articulation according to a peak value Q indicative of the sharpness of a local peak.

Upon determination of the performance parameters by the performance parameter determining section 24, the musical composition data based on the determined performance parameters is outputted to the musical composition generating section 25.

The musical tone generating section 25 generates performance data according to the musical composition data supplied from the performance parameter determining section 24, and outputs the performance data to the speaker system SS. The speaker system SS generates a musical tone signal from the performance data and outputs the generated musical tone signal to the speaker selected by the speaker selecting section 26. With this arrangement, musical tones are sounded via only the speaker selected by the speaker selecting section 26.

As is clear from the above description, the musical tone generating apparatus 600 carries out generation of musical tones and the like in a manner reflecting motion of the operator carrying the operating terminal 800, and the main body CPU 10 detects the direction in which the operator is located to sound musical tones via the flat speaker(s) or the like having an orientation toward the detected direction of the operator. Therefore, even if the operator operates the operating terminal 800 while moving, he/she can well listen to good musical tones sounded according to the operation A description will now be given of the operation of the present embodiment in a case where one operator controls performance and reproduction by operating the operating terminal 800.

Figure 11A:
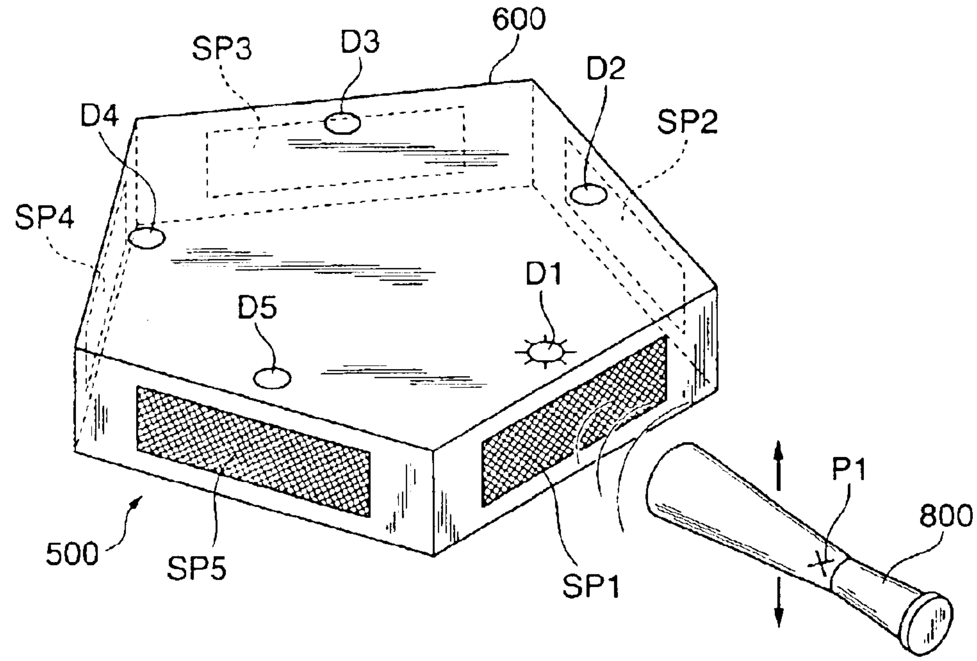
FIG. 11 is a view useful in explaining the operation of the musical tone generating apparatus.

If the operator located at the point P1 in FIG. 11A, for example, vertically shakes the operating terminal 800 with the mounting position of the operating switch T6 (refer to FIG. 3) facing upward after applying power to the musical tone generating apparatus 600 and the operating terminal 800 by operating the operating switch T6 of the operating terminal 800, the keyboard 10*e* of the musical tone generating apparatus 600, or the like, a signal indicative of the acceleration αx in the x-direction corresponding to the acceleration in shaking is generated and transmitted as motion information with an ID for identifying the signal as the one transmitted from the operating terminal 800 to the musical tone generating apparatus 600.

Upon receipt of the motion information with the ID from the operating terminal 800 via the antenna system AS, the radio communicating section 22 of the musical tone generating apparatus 600 compares the reception levels detected by the antennas AT1 to AT5 to specify the antenna detecting the highest reception level. In this case, the reception level detected by the antenna AT1 opposed to the operator is the highest, and thus, the radio communicating section 22 generates antenna identification information for identifying the antenna AT1 (referred to as "ID-AT1" for the convenience's sake) and supplies the same to the speaker selecting section 26. Further, the radio communicating section 22 refers to a table, not shown, to compare the ID assigned to the received motion information with IDs registered in a table, not shown, and after ascertaining that the same ID as the ID assigned to the motion information is registered in the table, the radio communicating section 22 outputs the motion information as acceleration data to the information analyzing section 23. The information analyzing section 23 analyzes the received acceleration data. If determining that the motion is the "vertical (x-direction) cutting motion", for example, the information analyzing section 23 outputs the determination result and information on the cycle of the "vertical (x-direction) cutting motion" to the performance parameter determining section 24.

Upon receipt of the antenna identification information ID-AT1 from the radio communicating section 22, the speaker selecting section 26 selects the speaker SP1 (refer to FIG. 4) arranged at the position corresponding to the antenna AT1 as the speaker for use in sounding and transmits an instruction for turning on the LED display unit D1 to the display circuit 17.

If determining that the motion is the "vertical (x-direction) cutting motion" based on the determination result and the like obtained by the information analyzing section 23, the performance parameter determining section 24 determines the performance tempo based on the cycle information supplied from the information analyzing section 23 and outputs musical composition data containing the determined performance tempo to the musical tone generating section 25. The musical tone generating section 25 generates performance data according to the musical composition data supplied from the performance parameter determining section 24, and outputs the performance data to the speaker system SS. The speaker system SS generates a musical tone signal from the received performance data, and transmits the generated musical tone signal to the speaker SP1 selected by the speaker selecting section 26. With this arrangement, the LED display unit D1 opposed to the operator is turned on, and musical tones are sounded via the speaker SP1 opposed to the operator (refer to FIG. 11A).

If the operator located at the point P1 then moves to the point P2 while performing the "vertical (x-direction) cutting motion" (refer to FIG. 11B), the radio communicating section 22 of the musical tone generating apparatus 600 finds that the antenna with the highest reception level is changed from the antenna AT1 to the antenna AT2. The radio communicating section 22 generates antenna identification information (hereinafter referred to as "ID-AT2" for the convenience's sake) for identifying the antenna AT2 as the antenna with the highest reception level, and supplies the same to the speaker selecting section 26. If ascertaining that the antenna identification information supplied from the radio communicating section 22 is changed (from ID-AT1 to ID-AT2), the speaker selecting section 26 selects the speaker SP2 (refer to FIG. 4) arranged at the position corresponding to the antenna AT2 as the speaker for use in sounding, and transmits an instruction for turning on the LED display unit D2 to the display circuit 17.

On the other hand, the performance parameter determining section 24 and the musical tone generating section 25 output performance data generated by carrying out the above described process to the speaker system SS. The speaker system SS generates a musical tone signal from the received performance data, and supplies the generated musical tone signal to the speaker SP2 selected by the speaker selecting section 26. With this arrangement, the LED display unit D2 opposed to the operator having moved from the pinot P1 to the point P2 is turned on, and musical tones are sounded via the speaker SP2 opposed to the operator (refer to FIG. 11A).

As described above, according to the first embodiment of the present invention, in the case where one operator controls performance and reproduction, the musical tone generating apparatus 600 sounds musical tones via the flat speaker that is oriented toward the direction in which the operator is located. Therefore, even if the operator operates the operating terminal 800 while moving, he/she can well listen to good musical tones sounded according to the operation.

Although in the above described first embodiment, it is assumed that musical tones are sounded only via the flat speaker having an orientation toward the direction in which the operator is located, the musical tones may be sounded via speakers disposed at both sides of the flat speaker so that the user and other listeners located in the vicinity of the musical tone generating apparatus 600 can listen to the musical tones. In the example shown in FIG. 11A, musical tones are sounded via the flat speaker SP1 having an orientation toward the direction in which the operator is located and the speakers SP2 and SP5 disposed at both sides of the flat speaker SP1. In this case, the volume of the musical tones sounded via the speaker SP1 and the volume of the musical tones sounded from the speakers SP2 and SP5 may be made equal, the volume of the musical tones sounded via the speaker SP1 is set to be greater than the volume of the musical tones sounded via the speakers SP2 and SP5 if it is intended that the operator can listen to good musical tones with the higher priority.

To be more specific, the musical tone generating apparatus 600 in FIG. 2 is provided with a volume determining section that determines the volume of musical tones to be sounded from each speaker. Once the speaker selecting section 26 has selected the speaker for use in sounding musical tones, the volume determining section determines the volume of the musical tones to be sounded via the selected speaker. For example, if the speaker selecting section 26 selects the flat speaker SP1 having an orientation toward the direction in which the operator is located and the speakers SP2 and SP5 disposed at both sides of the flat speaker SP1, the volume determining section sets the volume of musical tones to be sounded via the flat speaker SP1 to be greater than the volume of musical tones to be sounded via the speakers SP2 and SP5. In this way, control may be provided such that musical tones are sounded via not only one speaker but also a plurality of speakers.

In the above described first embodiment, it is assumed that the musical tone generating apparatus 600 is used which can be suitably used in the case where one operator operates the operating terminal 800 to control performance and reproduction. In a second embodiment of the present invention described hereinbelow, a musical tone generating apparatus is used which can be suitably used in a case where a plurality of operators operate the operating terminal 800 to control performance and reproduction of a plurality of parts (e.g. piano part and violin part).

Figure 12:
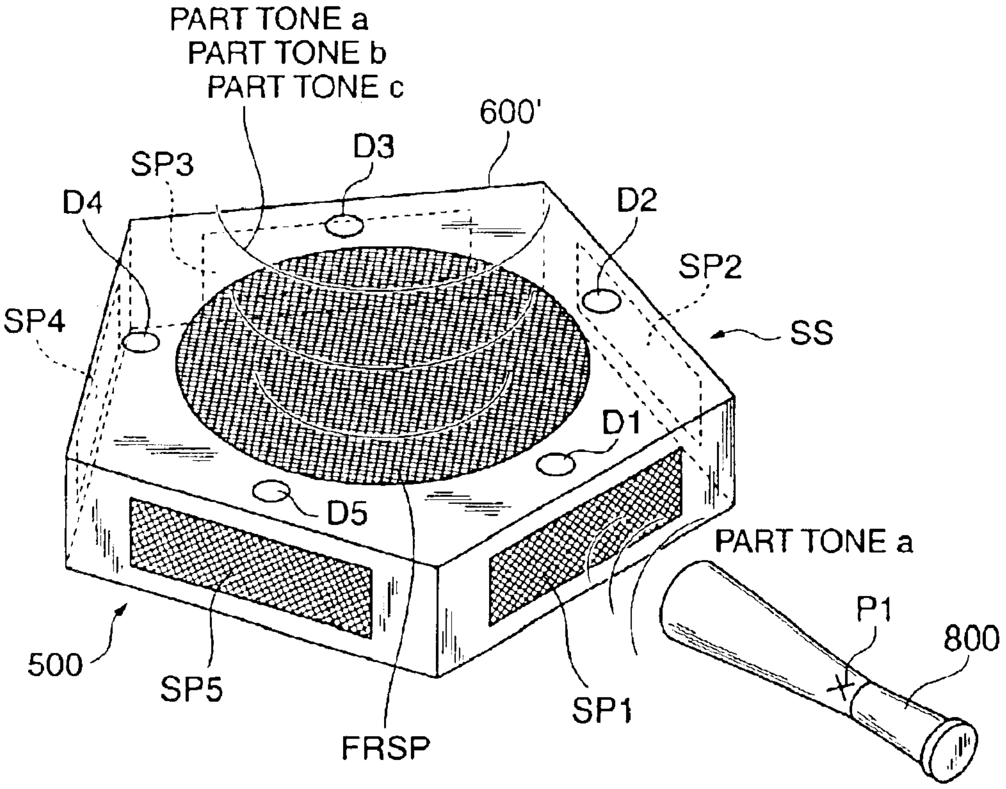
FIG. 12 is a view showing the appearance of a musical tone generating apparatus of a musical tone generation control system according to a second embodiment of the present invention.
Figure 13:
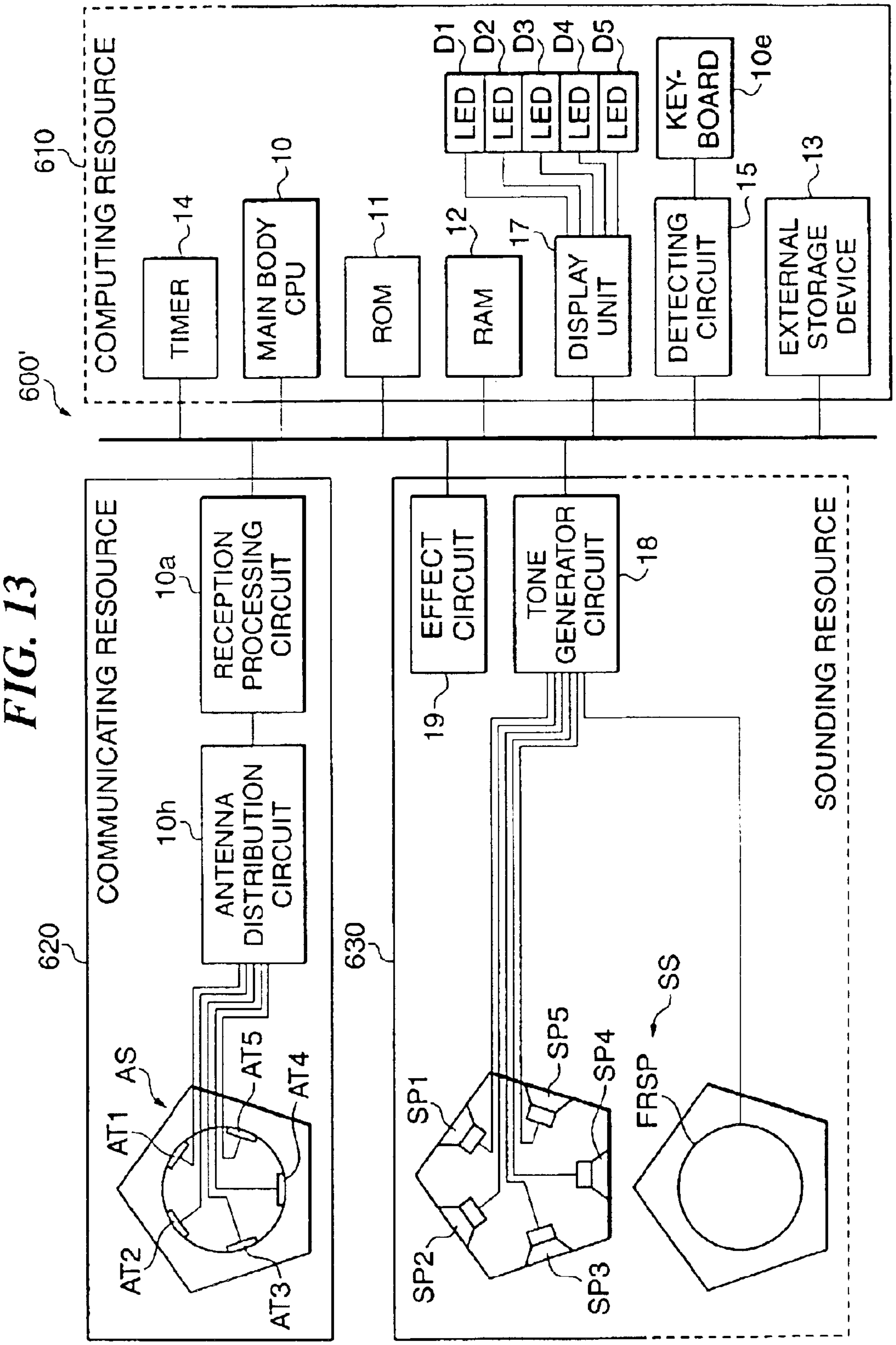
FIG. 13 is a view showing the arrangement of a musical tone generating apparatus.

FIG. 12 is a view showing the appearance of a musical tone generating apparatus 600' according to the second embodiment, and FIG. 13 is a view showing the construction of the musical tone generating apparatus 600'.

The musical tone generating apparatus 600' in FIGS. 12 and 13 is different from the above described musical tone generating apparatus 600 in FIGS. 4 and 6 in that a full range speaker FRSP is additionally provided. Elements and parts corresponding to those of the musical tone generating apparatus 600 are denoted by the same reference numerals, and a description thereof is omitted.

A speaker system SS of the musical tone generating apparatus 600' is comprised of five flat speakers SP1 to SP5 and one full range speaker FRSP as shown in FIG. 13.

The full range speaker FRSP is disposed at substantially the center of the upper surface of the musical tone generating apparatus 600' as shown in FIG. 12. The full range speaker FRSP sounds a plurality of part tones in which part tones are mixed, whereas the flat speakers SP1 to SP5 disposed at the sides of the musical tone generating apparatus 600' sound single part tones. Thus, each operator can listen to part tones of a part assigned to him/her (e.g. a part tone a in FIG. 12) via the flat speaker (e.g. the flat speaker SP1) corresponding to the present position (e.g. the point P1 in FIG. 12), and can also listen to all part tones including the part tone (e.g. the part tone a, a part tone b, and a part tone c) via the full range speaker FRSP. A detailed description of the musical tone generating operation will be given later during description of the operation of the present embodiment.

A description will now be given of the operation of the musical tone generating apparatus 600' according to the second embodiment in a case where two operators operate operating terminals 800 to control performance and reproduction of a musical composition composed of a plurality of parts including a piano part and a violin part. In the following description, it is assumed that one operator (hereinafter referred to as "operator A") operates the operating terminal 800-1 to control the volume of the piano part, and the other operator (hereinafter referred to as "operator B") operates the operating terminal 800-2 to control the volume of the violin part.

After applying power to the musical tone generating apparatus 600' and the operating terminal 800 by operating an operating switch T6 of the operating terminal 800 which he/she is operating, the keyboard 10*e* of the musical tone generating apparatus 600', or the like, each operator selects a musical composition (hereinafter referred to as "musical composition α") to be played and reproduced and makes settings as to a part assigned to him/her by operating the operating switch T6 of the operating terminal 800. After the selection of the musical composition α and the settings as to the part, a part management table TA relating to the selected musical composition α is stored in the RAM 12 of the musical tone generating apparatus 600'.

As shown in FIG. 14, a terminal ID ID-T1 identifying the operating terminal 800-1 operated by the operator A is registered in a terminal ID column corresponding to the piano part, and a terminal ID ID-T2 identifying the operating terminal 800-2 operated by the operator B is registered in a terminal ID column corresponding to the violin part. If the operator A located at the point P1 in FIG. 15A, for example, shakes the operating terminal 800 from side to side with the mounting position of the operating switch T6 (refer to FIG. 3) facing upward in the state in which the part management table TA is stored in the RAM 12, a signal indicative of the acceleration $\alpha y$ in the Y-direction corresponding to the acceleration in shaking is generated and transmitted as motion information with the terminal ID ID-T1 identifying the operating terminal 800-1 to the musical tone generating apparatus 600'.

Upon receipt of the motion information with the terminal ID ID-T1 assigned thereto from the operating terminal 800-1 via the antenna system AS, the radio communicating section 22 of the musical tone generating apparatus 600' compares the reception levels detected by the antennas AT1 to AT5 to specify the antenna detecting the highest reception level. In this case, the reception level detected by the antenna AT1 opposed to the operator is the highest, and thus, the radio communicating section 22 generates antenna identification information ID-AT1 for identifying the antenna AT1 and supplies the same to the speaker selecting section 26.

Further, the radio communicating section 22 specifies the operating terminal (the operating terminal 800-1 in this example) and a performance part (the piano part in this example) controlled by the operating terminal 800-1 with reference to the received terminal ID and the part management table TA stored in the RAM 12, notifies the performance parameter determining section 24 of the specified performance part (the piano part), and outputs the motion information as acceleration data to the information analyzing section 23.

The information analyzing section 23 analyzes the received acceleration data. If determining that the motion is the "horizontal (y-direction) cutting motion", the information analyzing section 23 outputs the determination result and information on the cycle of the "horizontal (y-direction) cutting motion" to the performance parameter determining section 24.

Upon receipt of the antenna identification information ID-AT1 from the radio communicating section 22, the speaker selecting section 26 selects the speaker SP1 (refer to FIG. 15A) disposed at the position corresponding to the antenna AT1 as the speaker for use in sounding and transmits an instruction for turning on the LED display unit D1 to the display circuit 17.

If determining that the motion is the "horizontal (y-direction) cutting motion" based on the determination result and the like obtained by the information analyzing section 23, the performance parameter determining section 24 determines the volume of the piano part based on the cycle information supplied from the information analyzing section 23 and the performance part (piano part) notified by the radio communicating section 22, and outputs musical composition data containing the piano part to the musical tone generating section 25. The musical tone generating section 25 generates performance data according to the musical composition data supplied from the performance parameter determining section 24, and outputs the performance data to the speaker system SS. The speaker system SS generates musical tone signals of a plurality of parts from the received performance data, and supplies the generated musical tone signals of the plurality of parts to the full range speaker FRSP and supplies the musical tone signal corresponding to the piano part among the generated musical tone signals of the plurality of parts to the speaker SP1 selected by the speaker selecting section 26.

Figure 15A:
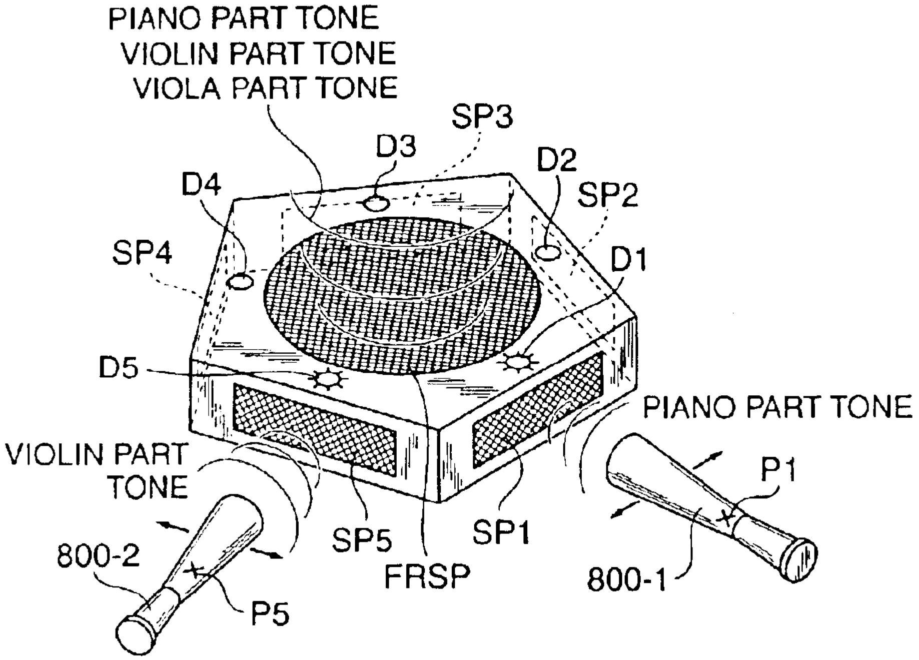
FIG. 15 is a view useful in explaining the operation of the musical tone generating apparatus of the musical tone generation control system according to the second embodiment.

With this arrangement, a plurality of part tones (a piano part tone, a violin part tone, and a viola part tone in FIG. 15A) including the part tone of the piano part with the volume having being controlled according to the operation of the operator A are sounded via the full range speaker FRSP, and the part tone of the piano part (the piano part tone in FIG. 15A) is sounded via the flat speaker SP1 corresponding to the present position of the operator A, and the LED display unit D1 is turned on.

The operator A who controls the volume of the piano part by operating the operating terminal 800-1 can recognize a difference in the volume of the part tone before and after the operation by listening to the part tone of the piano part sounded via the flat speaker SP1. On the other hand, the operator A can recognize the volume balance between the part tone of the piano part and part tones of the other parts by listening to the plurality of part tones including the part tone of the piano part sounded via the full range speaker FRSP.

On the other hand, when the operator B located at a point P5 starts operating the operating terminal 800-2 in order to control the volume of the violin part, the musical tone generating apparatus 600' carries out the same process as the above described process. As a result, a plurality of part tones including the part tone of the violin part with the volume having been controlled according to the operation of the operator B are sounded via the full range speaker FRSP, and the part tone of the violin part tone (the violin part tone in FIG. 15A) is sounded via the flat speaker SP5 corresponding to the present position (i.e. the point P5) of the operator B, and an LED display unit D5 is turned on. The operation and the like of the musical tone generating apparatus 600' in the case where the operator B located at the point P5 operates the operating terminal 800-2 are identical with those of the above described musical tone generating apparatus 600, and a description thereof is omitted.

Figure 15B:
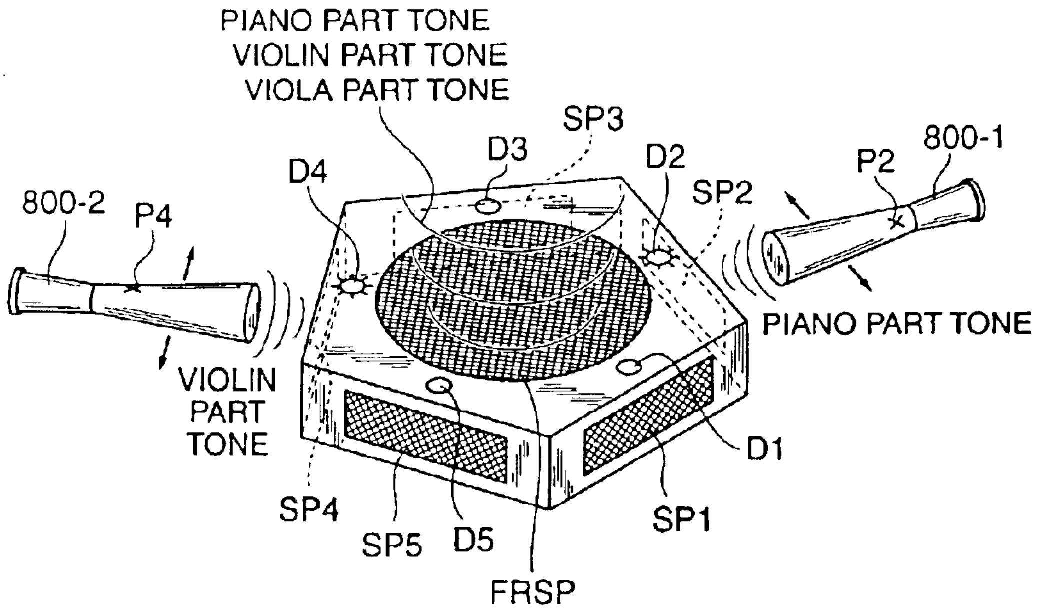

If the operator A located at the point P1 then moves to the point P2 while performing the "horizontal (y-direction) cutting motion" (refer to FIG. 15B), the radio communicating section 22 of the musical tone generating apparatus 600' finds that the antenna detecting the highest reception level is changed from the antenna AT1 to the antenna AT2. The radio communicating section 22 generates antenna identification information ID-AT2 for identifying the antenna AT2 and supplies the same to the speaker selecting section 26.

Further, the radio communicating section 22 specifies the operating terminal (the operating terminal 800-1 in this example) and the performance part (the piano part in this example) controlled by the operating terminal 800-1 with reference to the received terminal ID and the part management table TA stored in the RAM 12, notifies the performance parameter determining section 24 of the specified performance part (the piano part), and outputs the motion information as acceleration data to the information analyzing section 23.

The information analyzing section 23 analyzes the received acceleration data, and if determining that the motion is the "horizontal (y-direction) cutting motion" from the analysis result, the information analyzing section 23 outputs the determination result and information on the cycle of the "horizontal (y-direction) cutting motion" to the performance parameter determining section 24.

Upon detection of a change in the antenna identification information supplied from the radio communicating section 22 (ID-AT1→ID-AT2), the speaker selecting section 26 selects the speaker SP2 (refer to FIG. 15A) disposed at the position corresponding to the antenna AT2 as the speaker for use in sounding and transmits an instruction for turning on the LED display unit D2 to the display circuit 17.

On the other hand, the performance parameter determining section 24 and the musical tone generating section 25 output performance data generated by carrying out the above described process to the speaker system SS. With this arrangement, a plurality of part tones (a piano part tone, a violin part tone, and a viola part tone in FIG. 15B) including a part tone of the piano part with the volume having been controlled according to the operation of the operator A are sounded via the full range speaker FRSP, and the part tone of the piano part (the piano part tone in FIG. 15B) is sounded via the flat speaker SP2 corresponding to the present position (e.g. the point P2) of the operator A, and the LED display unit D2 is turned on.

The same process is carried out in a case where the operator B moves from the point P5 to the point P4 while performing the "horizontal (y-direction) cutting motion". With this arrangement, a plurality of part tones including the part tone of the violin part with the volume having been controlled according to the operation of the operator B are sounded via the full range speaker FRSP, and the part tone of the violin part (the violin part tone in FIG. 15B) is sounded via the flat speaker SP4 corresponding to the present position (e.g. the point P4) of the operator B, and the LED display unit D4 is turned on.

As described above, according to the second embodiment of the present invention, when a plurality of operators control performance and reproduction, the musical tone generating apparatus 600' causes a plurality of part tones to be sounded via the full range speaker FRSP, and causes part tones corresponding to the respective operators to be sounded via the flat speakers SP1 to SP5 having orientations toward the directions of the respective operators.

With this arrangement, as is the case with the first embodiment, even if the operator operates the operating terminal 800 while moving, he/she can well listen to good part tones varying according to the operation, and can recognize the influence (e.g. volume balance) of the part tones varying according to the operation on other part tones by listening to the plurality of part tones sounded via the full range speaker FRSP.

Although in the above described second embodiment, it is assumed that a plurality of operators control performance and reproduction, the present invention may be applied to a case where only one operator controls performance and reproduction. For example, if one operator controls performance and reproduction of a musical composition composed of a plurality of parts, he/she controls only a part tone of a part for which the operating terminal 800 has been operated (e.g. a part tone of a piano part). In this way, the present invention may be applied not only to the case where a plurality of operators control performance and reproduction but also to the case where one operator controls performance and reproduction.

It is to be understood, however, that there is no intention to limit the present invention to the embodiments disclosed, but various variations of the above described embodiments may be possible without departing from the spirits of the present invention, including variations as described below, for example.

Although in the above described first or second embodiment, it is assumed that the musical tone generating apparatus 600 or 600' is shaped like a pentagonal column with the flat speakers SP1 to SP5 attached on the sides, the present invention is not limited to this. In a variation 1, the present invention may be applied to musical tone generating apparatuses of all shapes such as a hexagonal column and a column insofar as flat speakers can be attached thereto.

Although in the above described first or second embodiment, it is assumed that the antenna system AS is used which is comprised of the antennas AT1 to AT5 having directivities (orientations) that detect the direction in which the operator is located, the present invention is not limited to this. In a variation 2, an antenna system may be used which is comprised of one directional antenna, and a rotating means for rotating the directional antenna. If such an antenna system is used, the direction in which the operator is located is found from reception timing for receiving motion information transmitted from the respective operating terminals 800, the rotational speed of the antenna having a directivity or orientation, and the like, and musical tones are sounded via a speaker having an orientation toward the found direction. The use of this antenna system enables a reduction in the number of antennas having directivities or orientations attached to the musical tone generating apparatus 600 or 600'.

Figure 16:
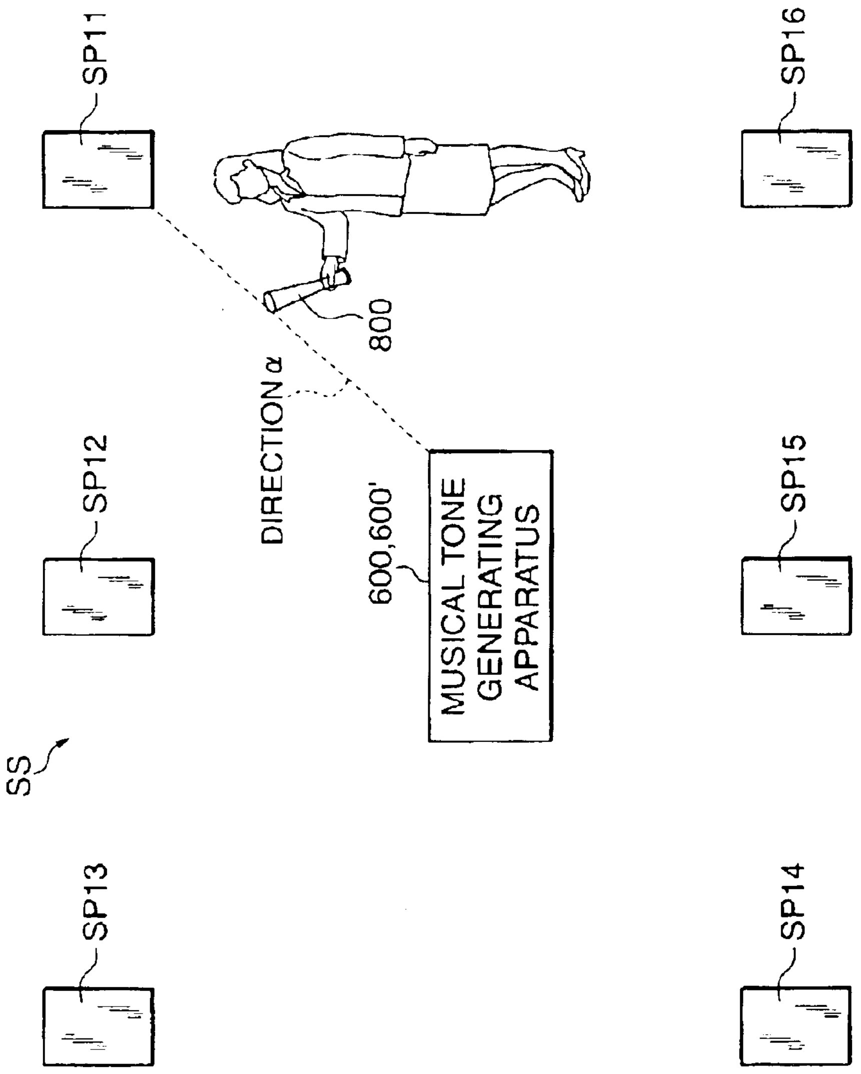
FIG. 16 is a view useful in explaining a musical tone generating apparatus and a speaker system of a musical tone generation control system according to a variation 3 of the first or second embodiment.

Although in the first or second embodiment, it is assumed that the speaker system SS is attached to the musical tone generating apparatus 600 or 600', the present invention is not limited to this. In a variation 3, the speaker system SS and the musical tone generating apparatus 600 or 600' may be configured as separate units (for example, the speaker system SS and the musical tone generating apparatus 600 or 600' may be connected to each other by wire or wireless) as shown in FIG. 16. In this case, the positions of speakers SP11 to SP16 constituting the speaker system SS are registered in advance in the musical tone generating apparatus 600 or 600', a speaker for use in sounding is selected according to the direction in which the operator is located, detected by the musical tone generating apparatus 600 or 600'. In the example shown in FIG. 16, the musical tone generating apparatus 600 or 600' detects the direction in which the operator is located (direction $\alpha$ in FIG. 16) according to a direction in which motion information transmitted from the operating terminal 800 is received, and selects a speaker positioned in the direction $\alpha$ (speaker SP11 in FIG. 16) as a speaker for use in sounding. Although in the variation 3, the speaker system SS is comprised of the six speakers SP11 to SP16, the present invention may cover all variations as to, for example, the number of speakers and the positions of the respective speakers with respect to the musical tone generating apparatus 600 or 600'.

Although in the first or second embodiment, the reception levels of the antennas AT1 to AT5 are compared to detect the direction in which is located the operator who is operating the operating terminal 800, the present invention is not limited to this. In a variation 4, the musical tone generating apparatus 600 or 600' may be comprised of an antenna having a directivity for use in receiving motion information transmitted from the operating terminal 800, for example, and a plurality of speakers configured separately from the musical tone generating apparatus 600 or 600' may be equipped with respective human body sensors (e.g. infrared sensors) for use in detecting the direction in which the operator is located.

Figure 17:
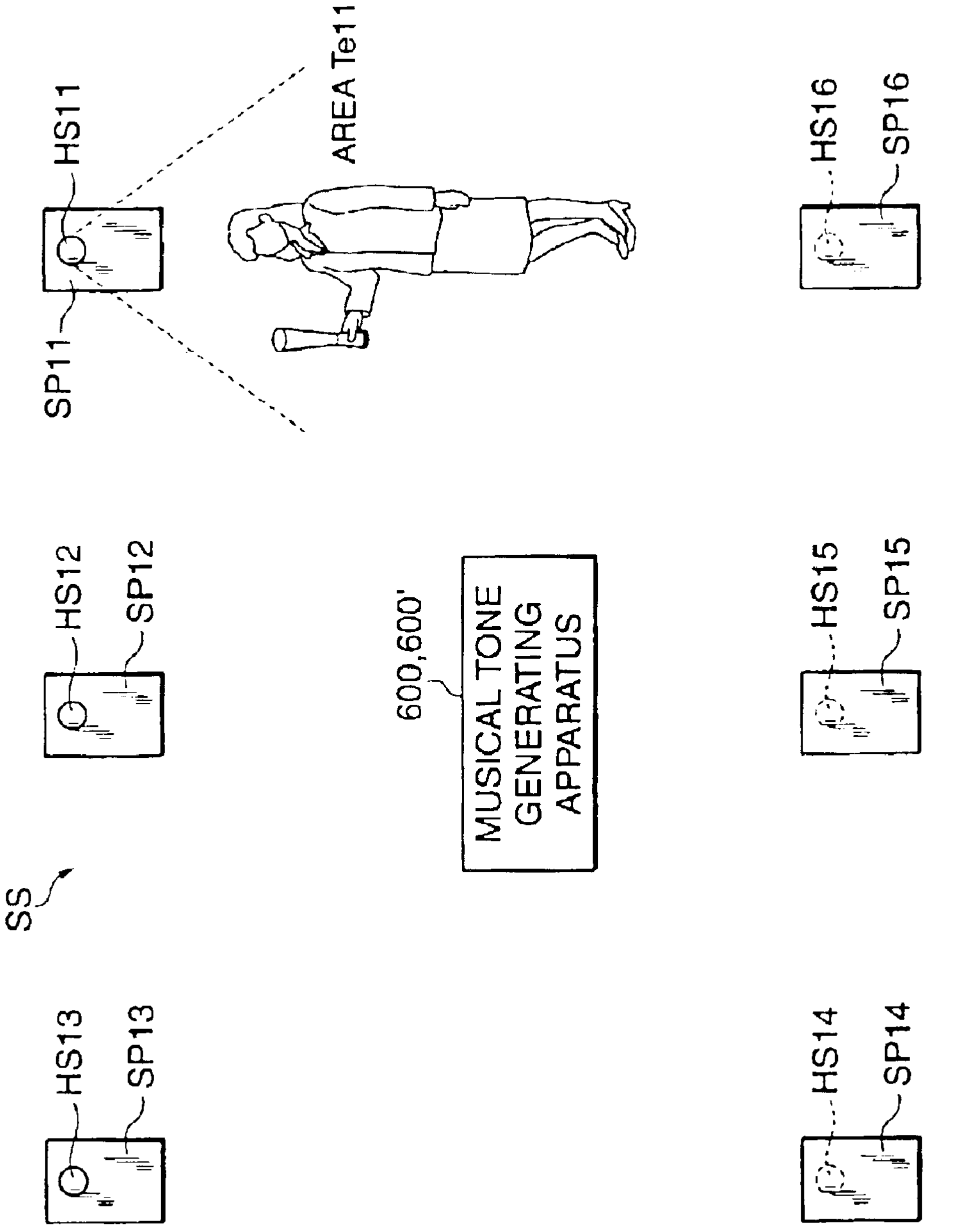
FIG. 17 is a view useful in explaining a musical tone generating apparatus, a speaker system, and a human body sensor of a musical tone generation control system according to a variation 4 of the first or second embodiment.

FIG. 17 is a view useful in explaining a case where the variation 4 is applied to the variation 2.

As shown in FIG. 17, human body sensors HS11 to HS16 are provided in upper parts of the respective speakers SP11 to SP16 according to the variation 4. The human body sensors HS11 to HS16 and the musical tone generating apparatus 600 or 600' are connected to each other by wire or wireless. Upon detection of the operator, the human body sensors HS11 to HS16 each transmit the detection result with a sensor ID assigned thereto to the musical tone generating apparatus 600 or 600'. It should be noted that the relationship between speaker IDs for identifying the speakers and sensor IDs for identifying the human body sensors (e.g. the human body sensor HS11 is provided in the speaker SP11) are registered in advance in the musical tone generating apparatus 600 or 600'. Upon reception of the detection result from the human body sensors, the musical tone generating apparatus 600 or 600' selects a speaker for use in sounding musical tones with reference to the sensor IDs assigned to the detection results.

In the example shown in FIG. 17, since the human body sensors are provided in the upper parts of the respective speakers, it is possible to detect which speaker corresponds to an area where the operator is located (e.g. area Te11 in FIG. 17). If the human body sensors are provided outside the speakers, the speaker for use in sounding musical tones may be selected according to the positional relationship between the speakers and the human body sensors. For example, if a certain human body sensor detects the operator, a speaker closest to the sensor is selected as a speaker for use in sounding musical tones. In this way, a speaker closest to the operator may be selected as a speaker for use in sounding musical tones.

A description will now be given of a variation 5 of the first or second embodiment of the present invention.

Figure 11B:
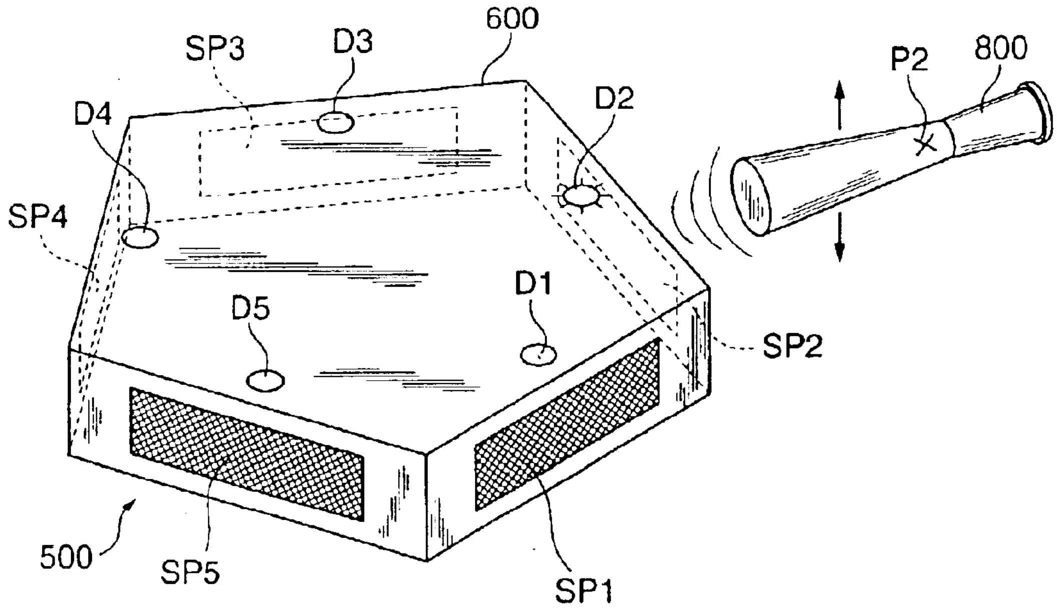
Figure 18A:
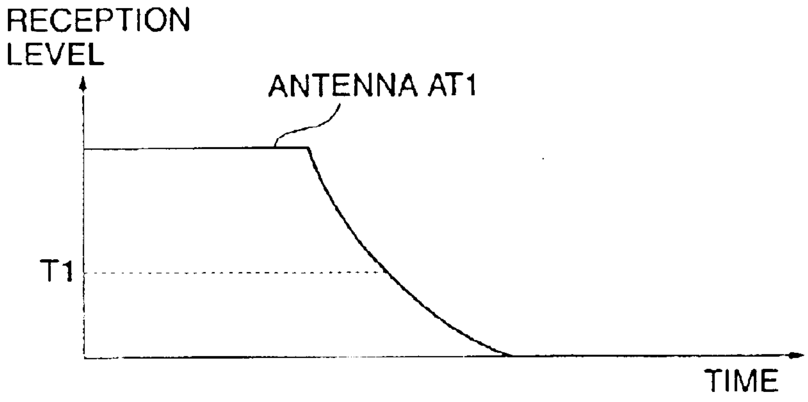
FIGS. 18A and 18B is a view showing a change in reception level of an antenna of a musical tone generation control system according to a variation 5 of the first or second embodiment.
Figure 18B:
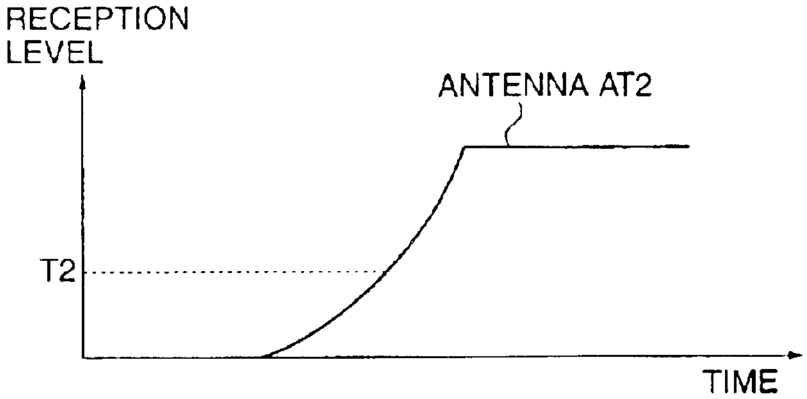

FIGS. 18A and 18B is a view showing a change in the reception level of the antennas AT1 and AT2 in a case where the operator moves from the point P1 (refer to FIG. 11A) to the point P2 (refer to FIG. 11B).

As the operator operating the operating terminal 800 moves from the point P1 toward the point P2, the reception level of the antenna AT1 goes down and the reception level of the antenna AT2 goes up with the movement (refer to FIGS. 18A and 18B). Assuming that the reception level of the antenna AT1 becomes smaller than a first threshold T1 and the reception level of the antenna AT2 becomes greater than a second threshold (refer to FIGS. 18A and 18B), it may be determined that the operator is located between the speakers SP1 and SP2 corresponding to the antennas AT1 and AT2, respectively, so that musical tones are sounded via the speakers SP1 and SP2. The volume of musical tones sounded via the respective speakers may be controlled to be equal, but the volume of musical tones sounded via the respective speakers may be different. For example, the volume of musical tones sounded via the speaker SP1 may be gradually decreased, and the volume of musical tones sounded via the speaker SP2 may be gradually increased.

A description will now be given of a variation 6 of the first or second embodiment of the present invention.

Figure 19:
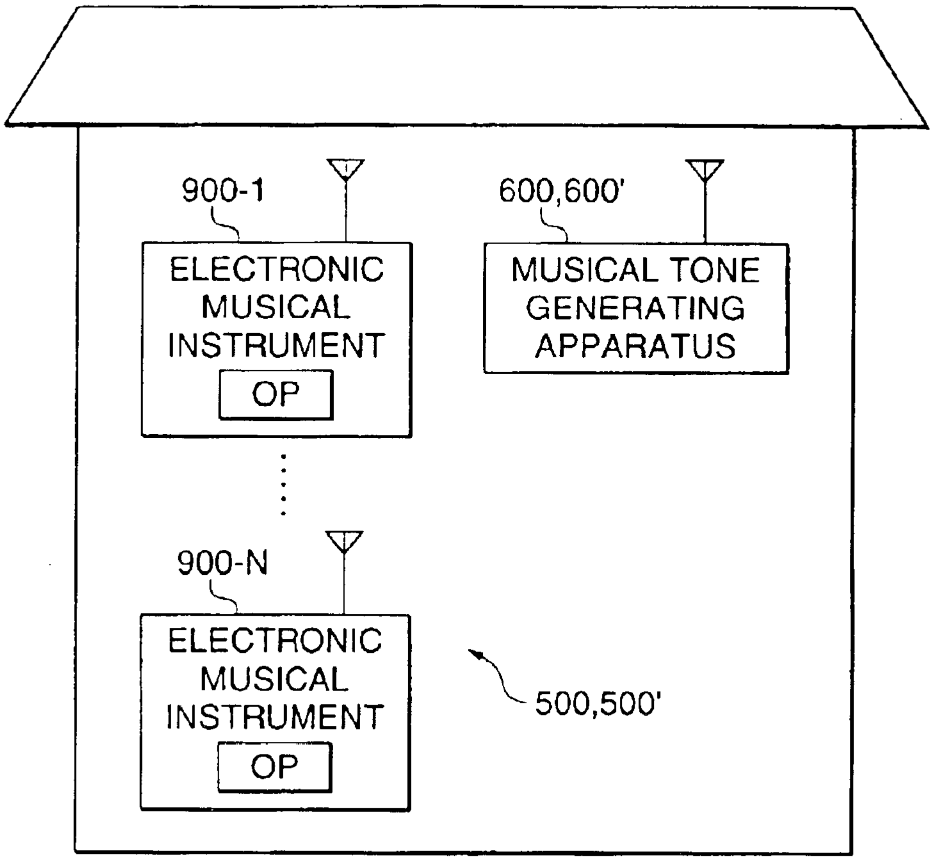
FIG. 19 is view showing the arrangement of a musical tone generation control system according to a variation 6 of the first or second embodiment.
Figure 20:
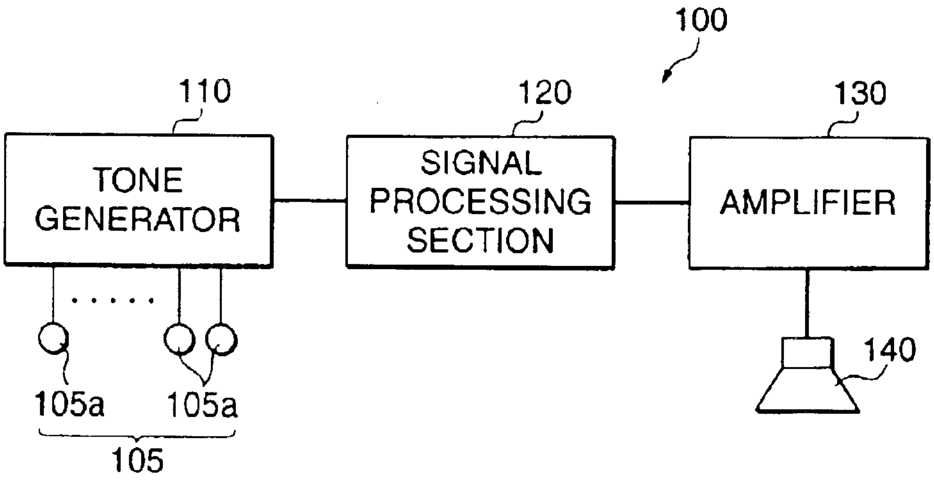
FIG. 20 is a view showing the arrangement of a musical tone generating apparatus according to the prior art.

FIG. 19 is a view showing the arrangement of a musical tone generation control system 500' according to the variation 6.

The musical tone generation control system 500' according to the variation 6 is provided with an electronic musical instrument(s) 900-N (N≧1) such as a synthesizer, electronic violin, or electronic saxophone having an operating element OP in place of the operating terminal 800 appearing in FIG. 1. It should be noted that the structure and the like of the musical tone generating apparatus 600 or 600' according to the variation 6 are substantially identical with those of the musical tone generating apparatus 600 or 600' appearing in FIG. 13 and a description thereof is omitted. In the following description, the electronic musical instruments 900-1 to 900-N will be referred to as "the electronic musical instrument 900" if there is no necessity of discriminating between them.

In a music school or the like in which the musical tone generation control system 500' is installed, if the player operates the operating element OP of the electronic musical instrument 900-1 in order to start playing a musical composition, the electronic musical instrument 900-1 radio-transmits operational information representing the operating condition of the operating element OP with a musical instrument ID for identifying the electronic musical instrument 900-1 assigned thereto to the musical tone generating apparatus 600 or 600'. Upon receipt of the operational information with the musical instrument ID assigned thereto, the musical tone generating apparatus 600 or 600' specifies the antenna detecting the highest reception level to detect the direction in which is located the player operating the electronic musical instrument 900-1 as is the case with the above described first embodiment. Upon detection of the detected direction of the player, the musical tone generating apparatus 600 or 600' selects a speaker that is located at a position opposed to the player as the speaker for use in sounding, and sounds musical tones corresponding to the operation of the player via the selected speaker. In this way, the present invention may be applied to the musical tone generation control system 500' including the electronic musical instrument 900. Although in this variation, the electronic musical instrument 900 and the musical tone generating apparatus 600 or 600' are radio-connected to each other, the electronic musical instrument 900 and the musical tone generating apparatus 600 or 600' may be connected to each other via a wire cable or the like.

It should be noted that in the musical tone generation control system 500', in a case where a plurality of players operate a plurality of electronic musical instruments at the same time, there can be a speaker that sounds musical tones corresponding to the plurality of electronic musical instruments (i.e. chords) as well as a speaker that sounds musical tones corresponding to one electronic musical instrument (i.e. monotones). In this case, the musical tone generating apparatus 600 or 600' determines the number of players operating each electronic musical instrument according to the operational information reception state to control the volume of the speaker that sounds monotones and control the volume of the speaker that sounds chords according to the determination result. In this manner, not only the speaker for sounding musical tones is selected but also the volume of musical tones sounded via the respective speakers may be controlled.

Further, the musical tone generating apparatus 600 or 600' according to the variation 6 detects the direction in which is located the player operating each electronic musical instrument to sound musical tones according to the operation of the player (hereinafter referred to as "performance tones" for the convenience's sake), the performance tones with accompaniment tones or the like added thereto may be sounded.

Specifically, accompaniment tone data for use in generating accompaniment tones is stored in the external storage device 13 or the like of the musical tone generating apparatus 600 or 600'. When playing a melody part of a musical composition by means of the electronic musical instrument, the player selects an accompaniment part corresponding to the melody part by operating the keyboard 10*e* of the musical tone generating apparatus 600 or 600' in order to sound accompaniment tones in accordance with the performance. Thereafter, if determining that the player has started operating the electronic musical instrument, the musical tone generating apparatus 600 or 600' reads out the accompaniment tone data set in advance by the player or the like from the external storage device 13 or the like to start generating the accompaniment tones.

The accompaniment tones thus generated are sounded together with the performance tones via the speaker selected by the speaker selecting section 26. The performance tones and the accompaniment tones may be sounded via one speaker according to the direction in which the player is located, but the performance tones and the accompaniment tones may be sounded via a plurality of speakers. In the case where the performance tones and the accompaniment tones are sounded via a plurality of speakers (e.g. three speakers), the performance tones and the accompaniment tones may be sounded via one speaker and only the performance tones may be sounded via the other two speakers and the volume of the musical tones to be sounded via the respective speakers may be controlled.

A description will now be given of a variation 8 of the first or second embodiment of the present invention.

Although in the above described embodiments and variations, the musical tone generation control system 500 or 500' has a plurality of operating terminals 800 and the musical tone generating apparatus 600 or 600', the musical tone generation control system 500 or 500' may have only the musical tone generating apparatus 600 or 600'. In further detail, the musical tone generating apparatus 600 or 600' according to the variation 8 has a known musical generating function, and may be comprised of a sensor (e.g. the human body sensor shown in the variation 3) that detects a listener listening to musical tones sounded from the musical tone generating apparatus 600 or 600' (refer to the prior art), and the speaker system SS comprised of a plurality of speakers having directivities or orientations. Upon detection of the direction in which the listener is located by the human body sensor or the like, the musical tone generating apparatus 600 or 600' causes musical tones to be sounded via a speaker having an orientation toward the detected direction of the listener. In this way, the present invention may be applied to the musical tone generation control system 500 or 500' that enables the user to listen to musical tones sounded from the musical tone generating apparatus 600 or 600'.

It is to be understood that the object of the present invention may also be accomplished by supplying a system or an apparatus with a storage medium in which a program code of software which realizes the functions of any of the above described embodiments or variations is stored, and causing a computer (or CPU or MPU) of the system or apparatus to read out and execute the program code stored in the storage medium.

In this case, the program code itself read from the storage medium realizes the functions of the embodiment or variation described above, and hence the program code and a storage medium on which the program code is stored constitute the present invention.

The storage medium for supplying the program code is not limited to a ROM, and a floppy (registered trademark) disk, a hard disk, an optical disk, a magnetic-optical disk, a CD-ROM, a CD-R, a CD-RW, a DVD-ROM, a DVD-RAM, a DVD−RW, a DVD+RW, a magnetic tape, a nonvolatile memory card, and a download performed via a network may be used.

Further, it is to be understood that the functions of any of the above described embodiments or variations may be accomplished not only by executing a program code read out by a computer, but also by causing an OS (operating system) or the like which operates on the computer to perform a part or all of the actual operations based on instructions of the program code.

Further, it is to be understood that the functions of any of the above described embodiments or variations may be accomplished by writing a program code read out from the storage medium into an expansion board inserted into a computer or a memory provided in an expansion unit connected to the computer and then causing a CPU or the like provided in the expansion board or the expansion unit to perform a part or all of the actual operations based on instructions of the program code.

What is claimed is:

1. A musical tone generation control system comprising:

a detecting device that detects information on a position of a listener;

a tone generator;

a plurality of speakers that sound musical tones corresponding to a musical tone signal supplied from said tone generator; and a controller that individually controls the volume of musical tones to be sounded from each of said plurality of speakers according to the position of the listener detected by said detecting device.

2. A musical tone generation control system according to claim 1, wherein said controller selects one speaker from said plurality of speakers according to the information on the position of the listener detected by said detecting device, supplies the musical tone signal only to the selected speaker, and controls a volume of musical tones to be sounded from the selected speaker.

3. A musical tone generation control system according to claim 1, wherein said controller specifies one speaker closest to the listener from said plurality of speakers according to the information on the position of the listener detected by said detecting device, and provides control such that a volume of musical tones to be sounded from the specified speaker is greater than a volume of musical tones to be sounded from the speakers other than the specified speaker.

4. A musical tone generation control system according to claim 1, wherein said plurality of speakers are arranged so as to have different orientations in which musical tones are sounded from said plurality of speakers, and said controller specifies a speaker having an orientation corresponding to an area where the listener is located, from said plurality of speakers, and provides control such that a volume of musical tones to be sounded from the specified speaker is greater than a volume of musical tones to be sounded from the speakers other than the specified speaker.

5. A musical tone generation control system according to claim 1, wherein said detecting device comprises a plurality of human body sensors provided for respective ones of said plurality of speakers.

6. A musical tone generation control system comprising:

at least one operating terminal that can be carried by an operator, said operating terminal comprising a generating device that generates motion information by detecting motion of said operating terminal operated by the operator, and a transmission device that transmits the motion information; and a musical tone generating apparatus comprising a receiving device that receives the motion information, a musical tone generating device that generates musical tones, and a controller that controls generation of the musical tones by said musical tone generating device according to the motion information received by said receiving device; and wherein:

said musical tone generating device comprises a tone generator, and a plurality of speakers that sound musical tones corresponding to a musical tone signal supplied from the tone generator;

said receiving device comprises a detecting device that detects information on a position of the operator according to a reception state of the motion information upon receiving the motion information; and said controller controls a volume of musical tones to be sounded from said plurality of speakers according to the information on the position of the operator detected by said detecting device.

7. A musical tone generation control system according to claim 6, wherein:

said detecting device comprises a plurality of antennas each having a directivity in one direction for receiving the motion information, said plurality of antennas being arranged in different orientations; and said detecting device detects the information on the position of the operator according to the reception state of the motion information received by the plurality of antennas.

8. A musical tone generation control system according to claim 6, wherein:

said detecting device comprises an antenna having a directivity in one direction for receiving the motion information, and a rotating device that rotates the antenna; and said detecting device detects the information on the position of the operator according to the reception state of the motion information received by the antenna that is rotated by said rotating device.

9. A musical tone generation control system comprising:

at least one operating terminal that can be carried by an operator, said operating terminal comprising a generating device that generates motion information by detecting motion of said operating terminal operated by the operator, and a transmission device that transmits the motion information; and a musical tone generating apparatus comprising a receiving device that receives the motion information, a detecting device that detects information on a position of the operator, a musical tone generating device that generates musical tones, and a controller that controls generation of the musical tones by said musical tone generating device according to the motion information received by said receiving device; and wherein:

said musical tone generating device comprises a tone generator, and a plurality of speakers that sound musical tones corresponding to a musical tone signal supplied from the tone generator; and said controller controls a volume of musical tones to be sounded from said plurality of speakers according to the information on the position of the operator detected by said detecting device.

10. A musical tone generation control system according to claim 9, wherein:

said detecting device comprises a plurality of human body sensors provided for respective ones of said plurality of speakers; and said controller specifies one speaker closest to the listener from said plurality of speakers according to the information on the position of the operator detected by said detecting device, and provides control such that a volume of musical tones to be sounded from the specified speaker is greater than a volume of musical tones to be sounded from the speakers other than the specified speaker.

11. A musical tone generation control system comprising:

at least one operating element unit that comprises a performance operating element and can be carried by a player;

a first detecting device that detects information on a position of the player carrying said operating element unit;

a second detecting device that detects an operating condition of the performance operating element;

a tone generator that generates a musical tone signal according to the operating condition of the performance operating unit detected by said second detecting device;

a plurality of speakers that sound musical tones corresponding to the musical tone signal generated by said tone generator; and a controller that controls a volume of the musical tones to be sounded from said plurality of speakers according to the information on the position of the player detected by said first detecting device.

12. A musical tone generation control system comprising:

at least one operating element unit that comprises a performance operating element and can be carried by a player;

a first detecting device that detects information on a position of the player carrying said operating element unit;

a second detecting device that detects an operating condition of the performance operating element;

a storage device that stores musical composition data;

a tone generator that generates a first musical tone signal according to the operating condition of the performance operating unit detected by said second detecting device, and generates a second musical tone signal different from the first musical tone signal, based on the musical composition data;

a plurality of speakers that comprise at least one speaker that sounds a monotone corresponding to either one of the first musical tone signal and the second musical tone signal generated by said tone generator, and at least one speaker that sounds a chord corresponding to both of the first musical tone signal and the second musical tone signal; and a controller that controls a volume of the monotone to be sounded from the at least one speaker that sounds the monotone and controls a volume ratio between respective musical tones constituting the chord to be sounded from the at least one speaker that sounds the chord, according to the information on the position of the player detected by said detecting device.

13. A musical tone generation control system comprising:

a plurality of operating element units that each comprise a performance operating element and can be carried by players;

a first detecting device that detects information on a position of each player carrying said operating element unit for each of said operating element units;

a second detecting device that detects an operating condition of the performance operating element of each of said operating element units for each of said operating element units;

a tone generator that generates a musical tone signal according to the operating condition of the performance operating unit of each of said operating element units detected by said second detecting device;

a plurality of speakers that comprise at least one speaker that sounds a monotone corresponding to one of the musical tone signals generated by said tone generator, and at least one speaker that sounds a chord corresponding to at least two of the musical tone signals; and a controller that controls a volume of the monotone to be sounded from the at least one speaker that sounds the monotone and controls a volume ratio between respective musical tones constituting the chord to be sounded from the at least one speaker that sounds the chord, according to the information on the position of the player detected by said detecting device.

14. A musical tone generation control method comprising the steps of:

detecting information on a position of a listener; and individually controlling the volume of musical tones to be sounded from each of a plurality of speakers according to the detected position of the listener.

15. A musical tone generation control method executed by a musical tone generation control system comprising at least one operating terminal that can be carried by an operator and comprises a generating device that generates motion information by detecting motion of said operating terminal operated by the operator, and a transmission device that transmits the motion information, and a musical tone generating apparatus comprising a receiving device that receives the motion information, a musical tone generating device that generates musical tones, a controller that controls generation of the musical tones by said musical tone generating device according to the motion information received by said receiving device, and wherein the musical tone generating device comprises a tone generator, and a plurality of speakers that sound musical tones corresponding to a musical tone signal supplied from the tone generator, the musical tone generation control method comprising the steps of:

causing a detecting device provided in the receiver device to detect information on a position of the operator according to a reception state of the motion information upon receiving the motion information; and causing the controller to control a volume of musical tones to be sounded from said plurality of speakers according to the information on the position of the operator detected by the detecting device.

16. A musical tone generation control method executed by a musical tone generation control system comprising at least one operating terminal that can be carried by an operator and comprises a generating device that generates motion information by detecting motion of said operating terminal operated by the operator, and a transmission device that transmits the motion information, and a musical tone generating apparatus comprising a receiving device that receives the motion information, a detecting device that detects information on a position of the operator, a musical tone generating device that generates musical tones, and a controller that controls generation of the musical tones by said musical tone generating device according to the motion information received by said receiving device, and wherein the musical tone generating device comprises a tone generator, and a plurality of speakers that sound musical tones corresponding to a musical tone signal supplied from the tone generator, the musical tone generation control method comprising the step of:

causing the controller to control a volume of musical tones to be sounded from the plurality of speakers according to the information on the position of the operator detected by the detecting device.

17. A musical tone generation control method executed by a musical tone generation control system comprising at least one operating element unit that comprises a performance operating element and can be carried by a player, a first detecting device, a second detecting device, a tone generator, a plurality of speakers, and a controller, the musical tone generation control method comprising the steps of:

causing the first detecting device to detect information on a position of the player carrying the operating element unit;

causing the second detecting device to detect an operating condition of the performance operating element;

causing the tone generator to generate a musical tone signal according to the operating condition of the performance operating element detected by the second detecting device;

causing the plurality of speakers to sound musical tones corresponding to the musical tone signal generated by the tone generator; and causing the controller to control a volume of the musical tones to be sounded from the plurality of speakers according to the information on the position of the player detected by the first detecting device.

18. A musical tone generation control method executed by a musical tone generation control system comprising at least one operating element unit that comprises a performance operating element and can be carried by a player, a first detecting device, a second detecting device, a storage device, a tone generator, a plurality of speakers, and a controller, the musical tone generation control method comprising the steps of:

causing the first detecting device to detect information on a position of the player carrying the operating element unit;

causing the second detecting device to detect an operating condition of the performance operating element;

storing musical composition data in the storage device;

causing the tone generator to generate a first musical tone signal according to the operating condition of the performance operating element detected by the second detecting device;

causing the tone generator to generate a second musical tone signal different from the first musical tone signal and based on the musical composition data;

causing at least one speaker of the plurality of speakers to sound a monotone corresponding to either one of the first musical tone signal and the second musical tone signal generated by the tone generator, and causing at least one speaker of the plurality of speakers to sound a chord corresponding to both of the first musical tone signal and the second musical tone signal; and causing the controller to control a volume of the monotone to be sounded from the at least one that sounds the monotone and controls a volume ratio between musical tones constituting the chord to be sounded from the at least one that sounds the chord according to the information on the position of the player detected by the detecting device.

19. A program for implementing a musical tone generation control method, comprising:

a detecting module for detecting information on a position of a listener; and a control module for individually controlling the volume of musical tones to be sounded from each of a plurality of speakers according to the position of the listener detected by said detecting module.

20. A program for implementing a musical tone generation control method executed by a musical tone generation control system comprising at least one operating terminal adapted to be carried by an operator, and a musical tone generating apparatus comprising a receiving device that receives the motion information, a musical tone generating device that generates musical tones, and a controller that controls generation of the musical tones by said musical tone generating device according to the motion information received by said receiving device; and wherein the musical tone generating device comprises a tone generator and a plurality of speakers that sound musical tones corresponding to a musical tone signal supplied from the tone generator, the program comprising:

a detecting module for causing a detecting device provided in the receiver device to detect information on a position of the operator according to a reception state of the motion information upon receiving the motion information; and a control module for causing the controller to control a volume of musical tones to be sounded from said plurality of speakers according to the information on the position of the operator detected by the detecting module.

21. A program for implementing a musical tone generation control method executed by a musical tone generation control system comprising at least one operating terminal that can be carried by an operator and comprises a generating device that generates motion information by detecting motion of said operating terminal operated by the operator, and a transmission device that transmits the motion information, and a musical tone generating apparatus comprising a receiving device that receives the motion information, a detecting device that detects information on a position of the operator, a musical tone generating device that generates musical tones, and a controller that controls generation of the musical tones by said musical tone generating device according to the motion information received by said receiving device, and wherein the musical tone generating device comprises a tone generator, and a plurality of speakers that sound musical tones corresponding to a musical tone signal supplied from the tone generator, the program comprising a control module for causing the controller to control a volume of musical tones to be sounded from the plurality of speakers according to the information on the position of the operator detected by the detecting device.

22. A program for implementing a musical tone generation control method executed by a musical tone generation control system comprising at least one operating element unit that comprises a performance operating element and can be carried by a player, a first detecting device, a second detecting device, a tone generator, a plurality of speakers, and a controller, the program comprising:

a first detecting module for causing the first detecting device to detect information on a position of the player carrying the operating element unit;

a second detecting module for causing the second detecting device to detect an operating condition of the performance operating element;

a generating module for causing the tone generator to generate a musical tone signal according to the operating condition of the performance operating element detected by the second detecting device;

a sounding module for causing the plurality of speakers to sound musical tones corresponding to the musical tone signal generated by the tone generator; and a control module for causing the controller to control a volume of the musical tones to be sounded from the plurality of speakers according to the information on the position of the player detected by the first detecting device.

23. A program for implementing a musical tone generation control method executed by a musical tone generation control system comprising at least one operating element unit that comprises a performance operating element and can be carried by a player, a first detecting device, a second detecting device, a storage device, a tone generator, a plurality of speakers, and a controller, the program comprising:

a first detecting module for causing the first detecting device to detect information on a position of the player carrying the operating element unit;

a second detecting module for causing the second detecting device to detect an operating condition of the performance operating element;

a storage module for storing musical composition data in the storage device;

a first generating module for causing the tone generator to generate a first musical tone signal according to the operating condition of the performance operating element detected by the second detecting device;

a second generating module for causing the tone generator to generate a second musical tone signal different from the first musical tone signal and based on the musical composition data;

a sounding module for causing at least one speaker of the plurality of speakers to sound a monotone corresponding to either one of the first musical tone signal and the second musical tone signal generated by the tone generator, and causing at least one speaker of the plurality of speakers to sound a chord corresponding to both of the first musical tone signal and the second musical tone signal; and a control module for causing the controller to control a volume of the monotone to be sounded from the at least one that sounds the monotone and controls a volume ratio between musical tones constituting the chord to be sounded from the at least one that sounds the chord according to the information on the position of the player detected by the detecting device.

* * * * *